US006799902B2

(12) United States Patent
Anderson et al.

(10) Patent No.: US 6,799,902 B2
(45) Date of Patent: Oct. 5, 2004

(54) OPTOELECTRONIC MOUNTING STRUCTURE

(75) Inventors: Gene R. Anderson, Albuquerque, NM (US); Marcelino G. Armendariz, Albuquerque, NM (US); Johnny R. F. Baca, Albuquerque, NM (US); Robert P. Bryan, Albuquerque, NM (US); Richard F. Carson, Albuquerque, NM (US); Dahwey Chu, Albuquerque, NM (US); Edwin B. Duckett, III, Albuquerque, NM (US); Frederick B. McCormick, Albuquerque, NM (US); David W. Peterson, Sandia Park, NM (US); Gary D. Peterson, Albuquerque, NM (US); Cathleen A. Reber, Corrales, NM (US); Bill H. Reysen, Lafayette, CO (US)

(73) Assignee: Emcore Corporation, Somerset, NJ (US)

( * ) Notice: Subject to any disclaimer, the term of this patent is extended or adjusted under 35 U.S.C. 154(b) by 397 days.

(21) Appl. No.: 09/749,283

(22) Filed: Dec. 26, 2000

(65) Prior Publication Data
US 2002/0122636 A1 Sep. 5, 2002

(51) Int. Cl.$^7$ .................................................. G02B 6/36
(52) U.S. Cl. ............................. 385/89; 385/88; 385/14
(58) Field of Search ............................. 385/14, 33, 35, 385/39, 49, 52, 88, 89, 92, 93, 94

(56) References Cited

U.S. PATENT DOCUMENTS

| | | |
|---|---|---|
| 3,996,461 A | 12/1976 | Sulzbach et al. |
| 4,145,110 A | 3/1979 | Szentesi |
| 4,276,113 A | 6/1981 | Carlesen et al. |
| 4,311,359 A | 1/1982 | Keller |

(List continued on next page.)

FOREIGN PATENT DOCUMENTS

| | | |
|---|---|---|
| DE | 40 02 370 A1 | 8/1991 |
| DE | 41 23 370 A1 | 1/1993 |
| EP | 0 259 888 A2 | 3/1988 |
| EP | 0 440 336 A2 | 8/1991 |
| EP | 0 589 622 A1 | 3/1994 |
| EP | 0 607 700 A | 7/1994 |
| EP | 0 710 861 A1 | 5/1996 |
| EP | 0 790 678 A2 | 8/1997 |
| EP | 0 899 592 | 3/1999 |
| EP | 0 607 700 B1 | 8/1999 |
| EP | 1 028 340 A1 | 8/2000 |
| EP | 1 028 341 A2 | 8/2000 |
| EP | 0 974 856 A2 | 11/2000 |

(List continued on next page.)

OTHER PUBLICATIONS

Robinson, et al., Low Cost Molded Packaging for Optical Data Links, 1994 IEEE Journal, pp. 312–316.

(List continued on next page.)

Primary Examiner—Phan T. H. Palmer
Assistant Examiner—Jennifer Doan
(74) Attorney, Agent, or Firm—White & Case LLP

(57) ABSTRACT

An optoelectronic mounting structure is provided that may be used in conjunction with an optical transmitter, receiver or transceiver module. The mounting structure may be a flexible printed circuit board. Thermal vias or heat pipes in the head region may transmit heat from the mounting structure to the heat spreader. The heat spreader may provide mechanical rigidity or stiffness to the heat region. In another embodiment, an electrical contact and ground plane may pass along a surface of the head region so as to provide an electrical contact path to the optoelectronic devices and limit electromagnetic interference. In yet another embodiment, a window may be formed in the head region of the mounting structure so as to provide access to the heat spreader. Optoelectronic devices may be adapted to the heat spreader in such a manner that the devices are accessible through the window in the mounting structure.

82 Claims, 16 Drawing Sheets

U.S. PATENT DOCUMENTS

| | | | |
|---|---|---|---|
| 4,327,964 A | 5/1982 | Haesly et al. | |
| 4,329,190 A | 5/1982 | Berg et al. | |
| 4,432,604 A | 2/1984 | Schwab | |
| 4,470,660 A | 9/1984 | Hillegonds et al. | |
| 4,479,698 A | 10/1984 | Landis et al. | |
| 4,547,039 A | 10/1985 | Caron et al. | |
| 4,563,725 A | 1/1986 | Kirby | |
| 4,597,631 A | 7/1986 | Flores | |
| 4,645,295 A | 2/1987 | Pronovost | |
| 4,678,264 A | 7/1987 | Bowen et al. | |
| 4,692,883 A | 9/1987 | Nelson et al. | |
| 4,708,833 A | 11/1987 | Ohsawa et al. | |
| 4,709,979 A | 12/1987 | Spodati et al. | |
| 4,729,623 A | 3/1988 | Mery | |
| 4,730,198 A * | 3/1988 | Brown et al. | 350/96.2 |
| 4,744,626 A | 5/1988 | Mery | |
| H491 H | 7/1988 | Pitruzzello et al. | |
| 4,767,179 A | 8/1988 | Sampson et al. | |
| 4,767,430 A | 8/1988 | Deneka et al. | |
| 4,772,123 A | 9/1988 | Radner | |
| 4,798,440 A | 1/1989 | Hoffer et al. | |
| 4,836,645 A | 6/1989 | Lefevre et al. | |
| 4,840,151 A | 6/1989 | Sakata | |
| 4,844,573 A | 7/1989 | Gillham et al. | |
| 4,845,052 A | 7/1989 | Abend | |
| 4,863,233 A | 9/1989 | Nienaber et al. | |
| 4,883,956 A | 11/1989 | Melcher et al. | |
| 4,973,127 A | 11/1990 | Cannon, Jr. et al. | |
| 4,979,787 A | 12/1990 | Lichtenberger | |
| 4,993,803 A | 2/1991 | Suverison et al. | |
| 5,013,247 A | 5/1991 | Watson | |
| 5,040,868 A | 8/1991 | Waitl et al. | |
| 5,042,709 A | 8/1991 | Cina et al. | |
| 5,042,891 A | 8/1991 | Mulholland et al. | |
| 5,050,953 A | 9/1991 | Anderson et al. | |
| 5,054,879 A | 10/1991 | Brown | |
| 5,061,033 A | 10/1991 | Richard | |
| 5,067,785 A | 11/1991 | Schirbl et al. | |
| 5,071,219 A | 12/1991 | Yurtin et al. | |
| 5,076,656 A | 12/1991 | Briggs et al. | |
| 5,076,688 A | 12/1991 | Bowen et al. | |
| 5,091,991 A | 2/1992 | Briggs et al. | |
| 5,101,465 A | 3/1992 | Murphy | |
| 5,104,243 A | 4/1992 | Harding | |
| 5,109,447 A | 4/1992 | Chan | |
| 5,109,453 A | 4/1992 | Edwards et al. | |
| 5,113,461 A | 5/1992 | Ortiz, Jr. | |
| 5,117,476 A | 5/1992 | Yingst et al. | |
| 5,127,073 A | 6/1992 | Mulholland et al. | |
| 5,138,679 A | 8/1992 | Edwards et al. | |
| 5,138,680 A | 8/1992 | Briggs et al. | |
| 5,151,961 A | 9/1992 | Hvezda et al. | |
| 5,155,784 A | 10/1992 | Knott | |
| 5,155,786 A | 10/1992 | Ecker et al. | |
| 5,163,109 A | 11/1992 | Okugawa et al. | |
| 5,165,002 A | 11/1992 | Cumberledge et al. | |
| 5,168,537 A | 12/1992 | Rajasekharan et al. | |
| 5,195,156 A | 3/1993 | Freeman et al. | |
| 5,199,087 A | 3/1993 | Frazier | |
| 5,202,943 A | 4/1993 | Carden et al. | |
| 5,204,925 A | 4/1993 | Bonanni et al. | |
| 5,212,754 A | 5/1993 | Basavanhally et al. | |
| 5,214,444 A | 5/1993 | Kerr et al. | |
| 5,226,052 A | 7/1993 | Tanaka et al. | |
| 5,230,030 A | 7/1993 | Hartman et al. | |
| 5,231,685 A | 7/1993 | Hanzawa et al. | |
| 5,233,676 A | 8/1993 | Yonemura et al. | |
| 5,233,677 A | 8/1993 | Winslow | |
| 5,239,606 A | 8/1993 | Shibutani et al. | |
| 5,243,678 A | 9/1993 | Schaffer et al. | |
| 5,245,683 A | 9/1993 | Belenkiy et al. | |
| 5,251,614 A | 10/1993 | Cathignol et al. | |
| 5,259,053 A | 11/1993 | Schaffer et al. | |
| 5,263,108 A | 11/1993 | Kurokawa et al. | |
| 5,280,551 A | 1/1994 | Bowen | |
| 5,295,214 A | 3/1994 | Card et al. | |
| 5,309,537 A | 5/1994 | Chun et al. | |
| 5,325,454 A | 6/1994 | Rittle et al. | |
| 5,325,455 A | 6/1994 | Henson et al. | |
| 5,329,604 A | 7/1994 | Baldwin et al. | |
| 5,333,225 A | 7/1994 | Jacobowitz et al. | |
| 5,337,396 A | 8/1994 | Chen et al. | |
| 5,337,398 A | 8/1994 | Benzoni et al. | |
| 5,341,446 A | 8/1994 | Shibata | |
| 5,345,527 A | 9/1994 | Lebby et al. | |
| 5,345,529 A | 9/1994 | Sizer et al. | |
| 5,347,604 A | 9/1994 | Go et al. | |
| 5,353,364 A | 10/1994 | Kurashima | |
| 5,359,686 A | 10/1994 | Galloway et al. | |
| 5,361,318 A | 11/1994 | Go et al. | |
| 5,371,820 A | 12/1994 | Welbourn et al. | |
| 5,371,822 A | 12/1994 | Horwitz et al. | |
| 5,386,488 A | 1/1995 | Oikawa | |
| 5,390,271 A | 2/1995 | Priest | |
| 5,394,503 A | 2/1995 | Dietz, Jr. et al. | |
| 5,416,872 A | 5/1995 | Sizer, II et al. | |
| 5,418,875 A | 5/1995 | Nakano et al. | |
| 5,420,954 A | 5/1995 | Swirhun et al. | |
| 5,428,704 A | 6/1995 | Lebby et al. | |
| 5,430,820 A | 7/1995 | van Tongeren et al. | |
| 5,434,939 A | 7/1995 | Matsuda | |
| 5,436,997 A | 7/1995 | Makiuchi et al. | |
| 5,436,998 A | 7/1995 | Morgan et al. | |
| 5,440,658 A | 8/1995 | Savage, Jr. | |
| 5,450,508 A | 9/1995 | Decusatis et al. | |
| 5,450,514 A | 9/1995 | Hotea et al. | |
| 5,452,388 A | 9/1995 | Rittle et al. | |
| 5,473,716 A | 12/1995 | Lebby et al. | |
| 5,475,215 A | 12/1995 | Hsu | |
| 5,475,783 A | 12/1995 | Kurashima | |
| 5,502,785 A | 3/1996 | Wang et al. | |
| 5,506,921 A | 4/1996 | Horie | |
| 5,511,089 A | 4/1996 | Yamada | |
| 5,515,467 A | 5/1996 | Webb | |
| 5,521,992 A | 5/1996 | Chun et al. | |
| 5,522,002 A | 5/1996 | Chun et al. | |
| 5,524,160 A | 6/1996 | Debeaux et al. | |
| 5,535,296 A * | 7/1996 | Uchida | 385/89 |
| 5,539,848 A | 7/1996 | Galloway | |
| 5,546,490 A | 8/1996 | Kikuchi et al. | |
| 5,548,676 A | 8/1996 | Savage, Jr. | |
| 5,577,145 A | 11/1996 | Musk | |
| 5,577,146 A | 11/1996 | Musk | |
| 5,596,663 A | 1/1997 | Ishibashi et al. | |
| 5,596,665 A | 1/1997 | Kurashima et al. | |
| 5,602,955 A | 2/1997 | Haake | |
| 5,604,831 A | 2/1997 | Dittman et al. | |
| 5,625,734 A | 4/1997 | Thomas et al. | |
| 5,630,988 A | 5/1997 | Stolp | |
| 5,631,988 A | 5/1997 | Swirhun et al. | |
| 5,647,042 A | 7/1997 | Ochiai et al. | |
| 5,657,409 A | 8/1997 | Raskin et al. | |
| 5,677,973 A | 10/1997 | Yuhara et al. | |
| 5,727,097 A | 3/1998 | Lee et al. | |
| 5,742,480 A | 4/1998 | Sawada et al. | |
| 5,745,624 A | 4/1998 | Chan et al. | |
| 5,768,456 A | 6/1998 | Knapp et al. | |
| 5,774,614 A | 6/1998 | Gilliland et al. | |
| 5,781,682 A | 7/1998 | Cohen et al. | |
| 5,790,733 A * | 8/1998 | Smith et al. | 385/88 |
| 5,796,714 A | 8/1998 | Chino et al. | |
| 5,812,582 A | 9/1998 | Gilliland et al. | |
| 5,812,717 A | 9/1998 | Gilliland et al. | |
| 5,815,623 A | 9/1998 | Gilliland et al. | |
| 5,818,990 A | 10/1998 | Steijer et al. | |
| 5,845,026 A | 12/1998 | Lee et al. | |
| 5,857,047 A | 1/1999 | Strand et al. | |
| 5,857,050 A | 1/1999 | Jiang et al. | |
| 5,859,947 A | 1/1999 | Kiryuscheva et al. | |
| 5,870,518 A | 2/1999 | Haake et al. | |

| | | | |
|---|---|---|---|
| 5,879,173 A | 3/1999 | Poplawski et al. | |
| 5,883,748 A | 3/1999 | Shum | |
| 5,896,481 A | 4/1999 | Beranek et al. | |
| 5,907,571 A | 5/1999 | Ogino et al. | |
| 5,914,976 A | 6/1999 | Jayaraman et al. | |
| 5,920,670 A | 7/1999 | Lee et al. | |
| 5,940,562 A | 8/1999 | Henson et al. | |
| 5,963,693 A | 10/1999 | Mizue et al. | |
| 5,963,696 A | 10/1999 | Yoshida et al. | |
| 5,980,312 A | 11/1999 | Chapman et al. | |
| 5,985,185 A | 11/1999 | Steijer et al. | |
| 5,987,202 A | 11/1999 | Gruenwald et al. | |
| 5,997,185 A | 12/1999 | Kropp | |
| 6,004,042 A | 12/1999 | Million et al. | |
| 6,004,044 A | 12/1999 | Paulus et al. | |
| 6,005,991 A | 12/1999 | Knasel | |
| 6,012,855 A | 1/2000 | Hahn | |
| 6,014,713 A | 1/2000 | Agnew et al. | |
| 6,015,239 A | 1/2000 | Moore | |
| 6,023,339 A | 2/2000 | Haugsjaa et al. | |
| 6,028,724 A | 2/2000 | Leib | |
| 6,034,808 A | 3/2000 | Isaksson | |
| 6,040,624 A | 3/2000 | Chambers et al. | |
| 6,048,107 A | 4/2000 | Pubanz | |
| 6,056,448 A * | 5/2000 | Sauter et al. | 385/92 |
| 6,061,493 A | 5/2000 | Gilliland et al. | |
| 6,062,739 A | 5/2000 | Blake et al. | |
| 6,071,015 A | 6/2000 | Erbse et al. | |
| 6,071,017 A | 6/2000 | Gilliland et al. | |
| 6,074,103 A | 6/2000 | Hargreaves et al. | |
| 6,075,911 A | 6/2000 | Goto | |
| 6,076,975 A | 6/2000 | Roth | |
| 6,076,976 A | 6/2000 | Kidd | |
| 6,079,881 A | 6/2000 | Roth | |
| 6,081,647 A | 6/2000 | Roth et al. | |
| 6,097,873 A | 8/2000 | Filas et al. | |
| 6,170,996 B1 | 1/2001 | Miura et al. | |
| 6,181,854 B1 | 1/2001 | Kojima et al. | |
| 6,195,261 B1 | 2/2001 | Babutzka et al. | |
| 6,203,339 B1 | 3/2001 | Nieminen | |
| 6,217,231 B1 | 4/2001 | Mesaki et al. | |
| 6,235,141 B1 | 5/2001 | Feldman et al. | |
| 6,249,637 B1 | 6/2001 | Weigel | |
| 6,250,820 B1 * | 6/2001 | Melchior et al. | 385/89 |
| 6,305,848 B1 * | 10/2001 | Gregory | 385/53 |
| 6,325,551 B1 | 12/2001 | Williamson III et al. | |
| 6,354,747 B1 | 3/2002 | Irie et al. | |
| 6,396,191 B1 | 5/2002 | Hagelstein et al. | |
| 6,404,792 B1 | 6/2002 | Yamamoto et al. | |
| 6,411,638 B1 | 6/2002 | Johnson et al. | |
| 6,461,058 B1 | 10/2002 | Birch et al. | |

FOREIGN PATENT DOCUMENTS

| | | |
|---|---|---|
| GB | 1 304 428 A | 1/1973 |
| JP | 56 046573 | 4/1981 |
| JP | 56 079468 | 6/1981 |
| JP | 56 111822 | 9/1981 |
| JP | 60 156023 | 8/1985 |
| JP | 01 073304 | 3/1989 |
| JP | 05 102529 | 4/1993 |
| JP | 08 082724 | 3/1996 |
| JP | 09 043456 | 2/1997 |
| JP | 09 061683 | 3/1997 |
| JP | 09 197197 | 7/1997 |
| JP | 10 186162 | 7/1998 |
| JP | 10 197751 | 7/1998 |
| JP | 10 126002 | 8/1998 |
| JP | 10 239569 | 9/1998 |
| WO | WO 97 25638 A3 | 7/1997 |
| WO | WO 97 25641 | 7/1997 |
| WO | WO 98 31080 | 7/1998 |
| WO | WO 99 39230 | 8/1999 |
| WO | WO 00 13051 A1 | 3/2000 |
| WO | WO 00 46623 | 8/2000 |
| WO | WO 00 73833 A1 | 12/2000 |

OTHER PUBLICATIONS

Nagahori, et al., 1–Gbyte/sec Array Transmitter and Receiver Modules for Low–Cost Optical Fiber Interconnection, 996 Electronic Components & Technology Conference, $46^{th}$ Proceedings, pp. 255–258.

Niburg et al., A Complete Sub–System of Parallel Optical Interconnects for Telecom Applications, 1996 Electronic Components & Technology Conference, $46^{th}$ Proceedings, pp. 259–263.

de Pestel et al., Parallel Optical Interconnections for Future Broad Band Systems, Based on the "Fiber in Board Technology", 1996 Electronic Components & Technology Conference, $46^{th}$ Proceedings, pp. 264–266.

Wong et al., OptoElectronic Technology Consortium (OETC) Parallel Optical Data Link: Components, System Applications and Simulation Tools, 1996 Electronic Components & Technology Conference, $46^{th}$ Proceedings, pp. 269–278.

Lebby et al., Characteristics of VCSEL Arrays for Parallel Optical Interconnects, 1996 Electronic Components & Technology Conference, $46^{th}$ Proceedings, pp. 279–291.

Crow et al., The Jitney Parallel Optical Interconnect, 1996 Electronic Components & Technology Conference, $46^{th}$ Proceedings, pp. 292–300.

Hahn et al., Gigabyte/sec Data Communications with the POLO Parallel Optical Link, 1996 Electronic Components & Technology Conference, $46^{th}$ Proceedings, pp. 301–307.

Liu et al., Polymer Optical Interconnect Technology (POINT)—Optoelectronic Packaging and Interconnect for Board and Backplane Applications, 1996 Electronic Components & Technology Conference, $46^{th}$ Proceedings, pp. 308–315.

Swirhun et al., The P–VixeLink™Multichannel Optical Interconnect, 1996 Electronic Components & Technology Conference, $46^{th}$ Proceedings, pp. 316–320.

Carson et al., Low–Power Modular Parallel Photonic Data Links, 1996 Electronic Components & Technology Conference, $46^{th}$ Proceedings, pp. 321–326.

Kibar et al., Power Minimization and Technology Comparisons for Digital Free–Space Optoelectronic Interconnections, 1999 Journal of Lightwave Technology, vol. 17, No. 4, pp. 546–555.

Simonis et al., 1 Gb/s VCSEL/CMOS Flip–Chip 2–D Array Interconnects and Associated Diffactive Optics, 1999 Parallel Interconnect (PI '99), pp. 1–9.

Buckman et al., Parallel Optical Interconnects, Proc. Hot Interconnects VI, Stanford, CA, USA, Aug. 13–15, 1998, pp. 137–143.

Rosenberg et al., The PONI–1 Parallel–Optical Link, 49th Electronic Components & Technology Conference, San Diego, CA, Jun. 1–4, 1999, pp. 763–769.

Giboney et al., The PONI Optoelectronic Platform, IEEE Lasers and Electro–Optics Society 1999 Annual Meeting, San Francisco, CA, Nov. 8–9, 1999, pp. 25–26.

Buckman et al., Parallel Optical Interconnects, Conference on Lasers and Electro–Optics, San Francisco, CA, May 11, 2000, pp. 1–3.

Cheong, J–M et al.; High Alignment Tolerance Coupling Scheme for Multichannel Laser Diode/Singlemode Fibre Modules Using a Tapered Waveguide Array; Electronics Letters; IEE Stevenage; GB; vol. 30; No. 18; Sep. 1, 1994; pp. 1515–1516.

* cited by examiner

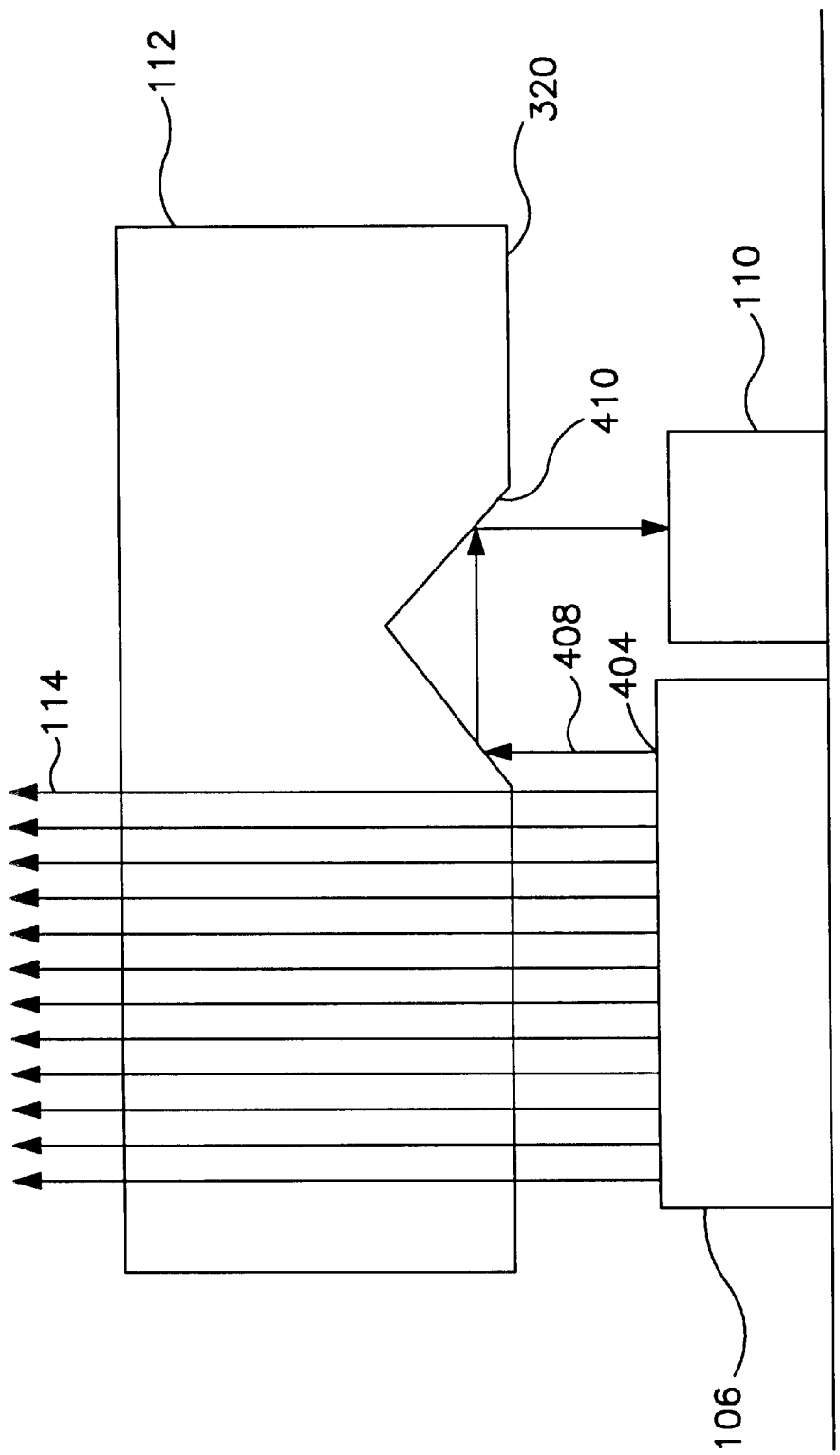

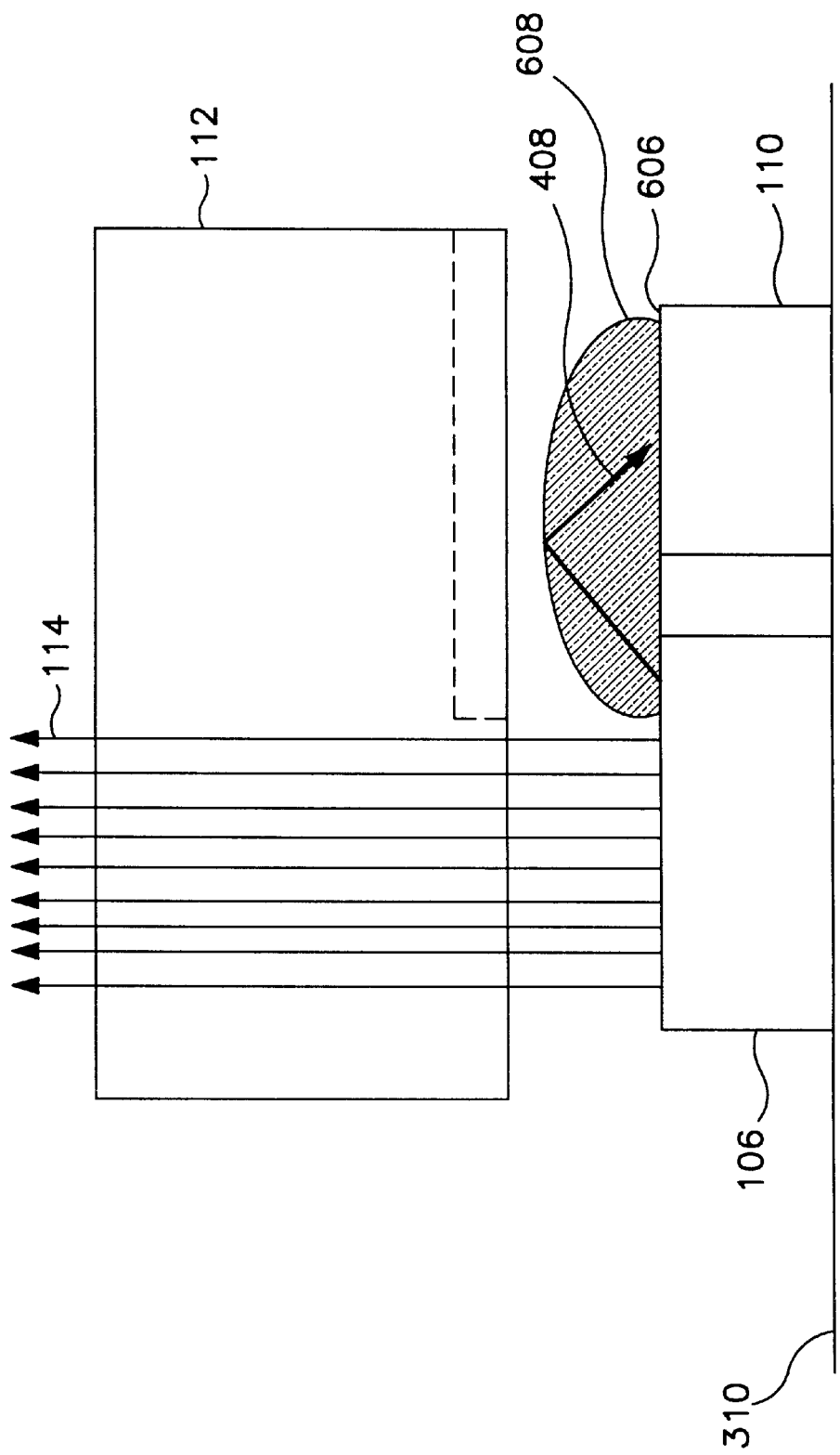

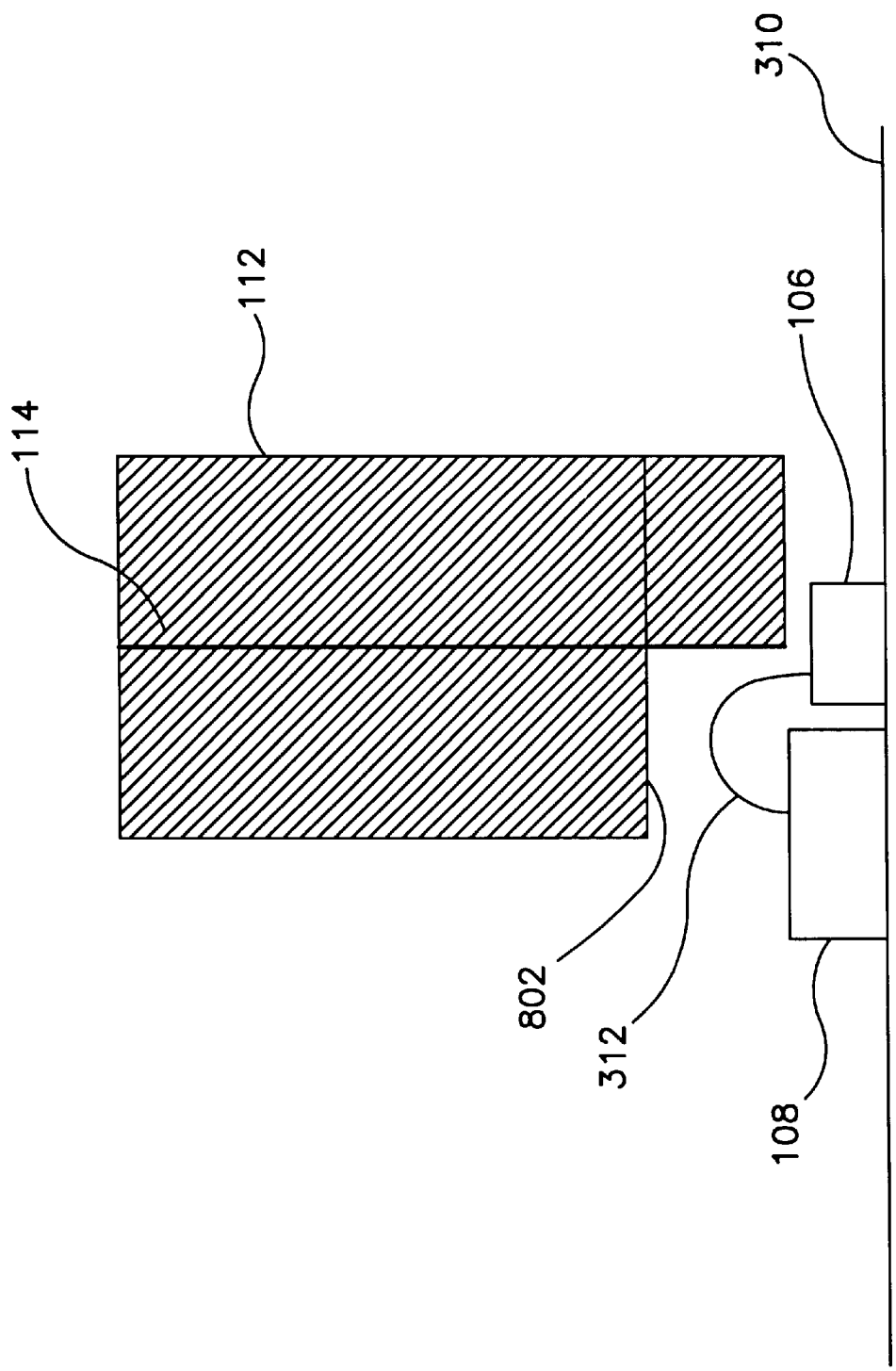

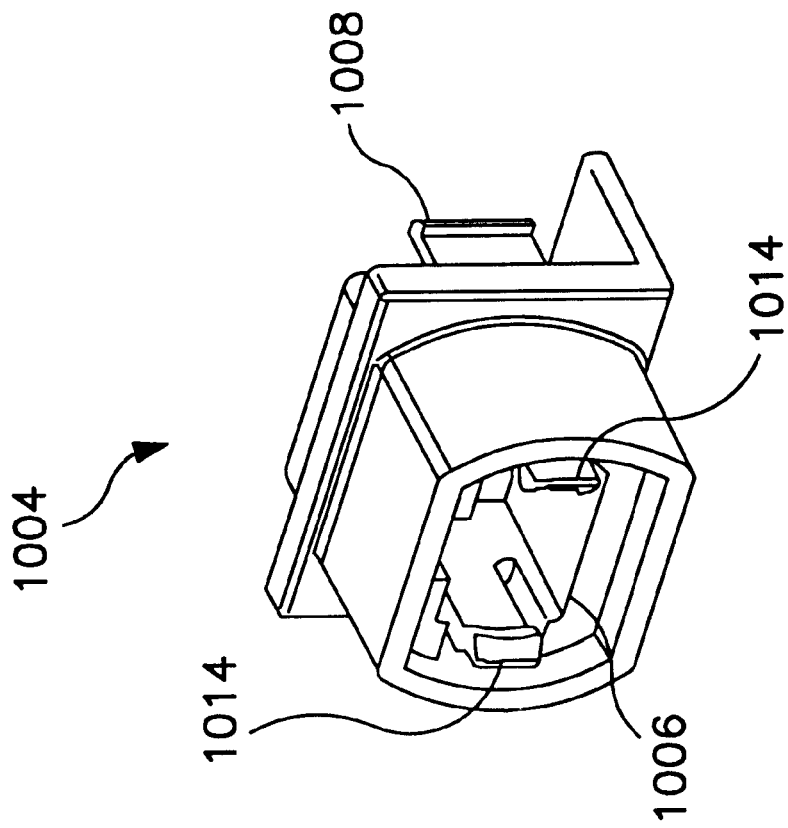
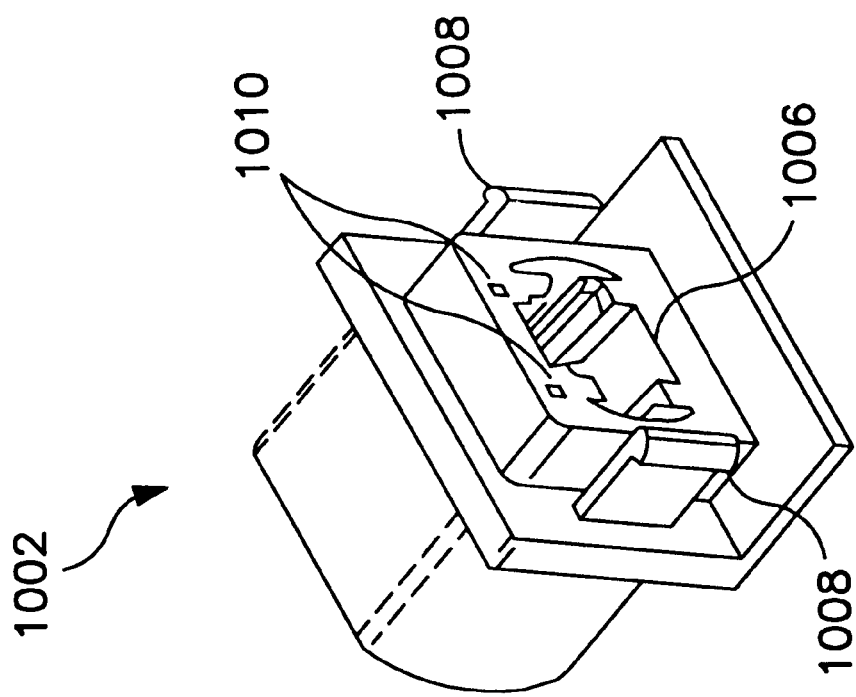
FIG. 10b
FIG. 10a

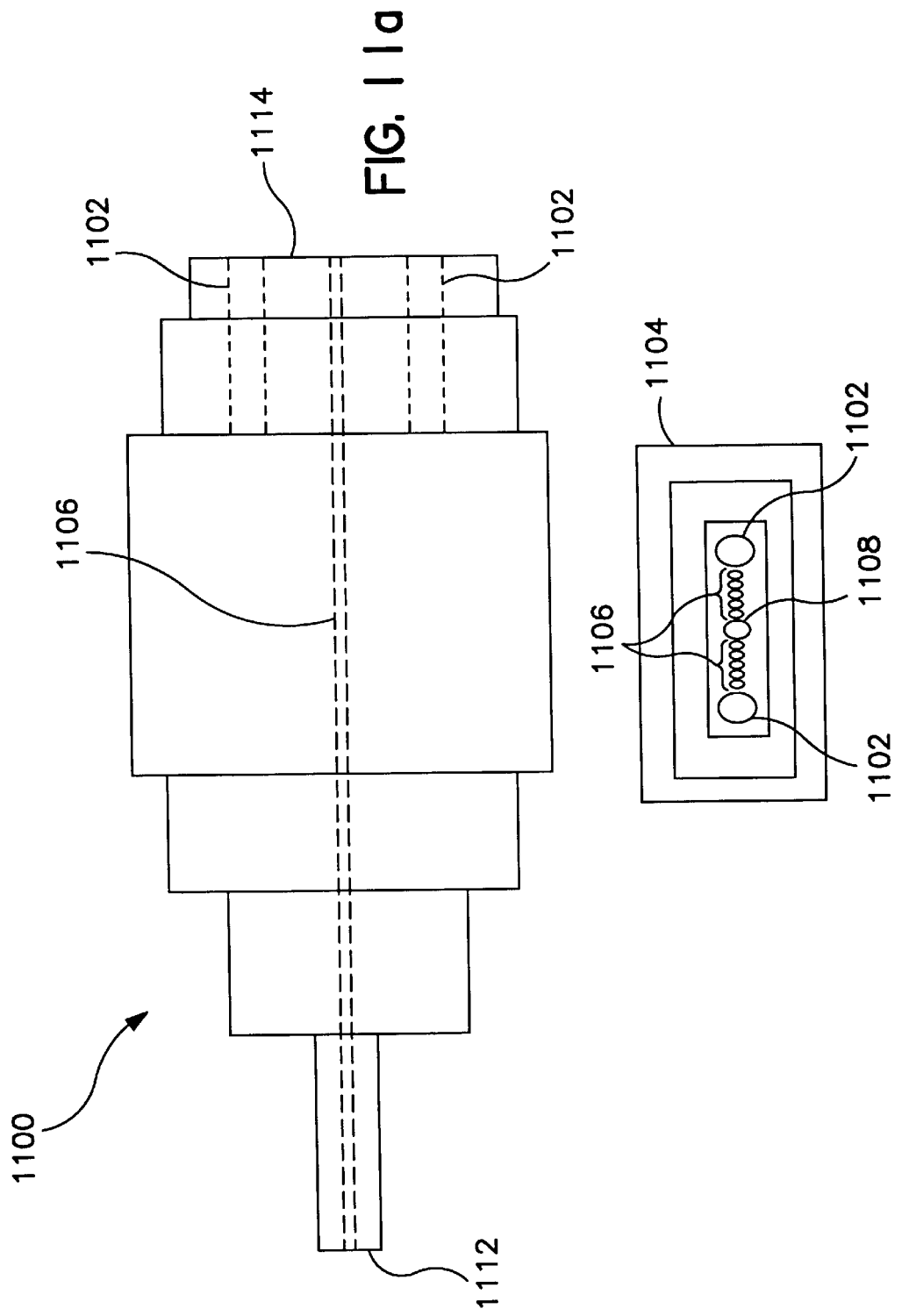

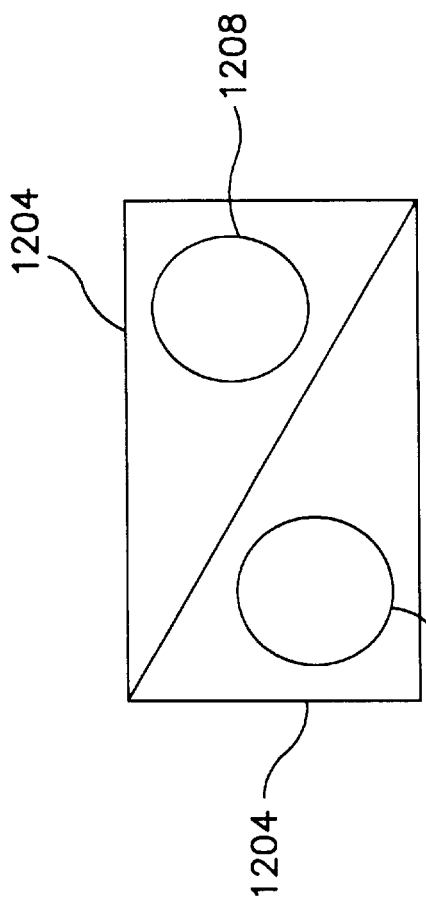
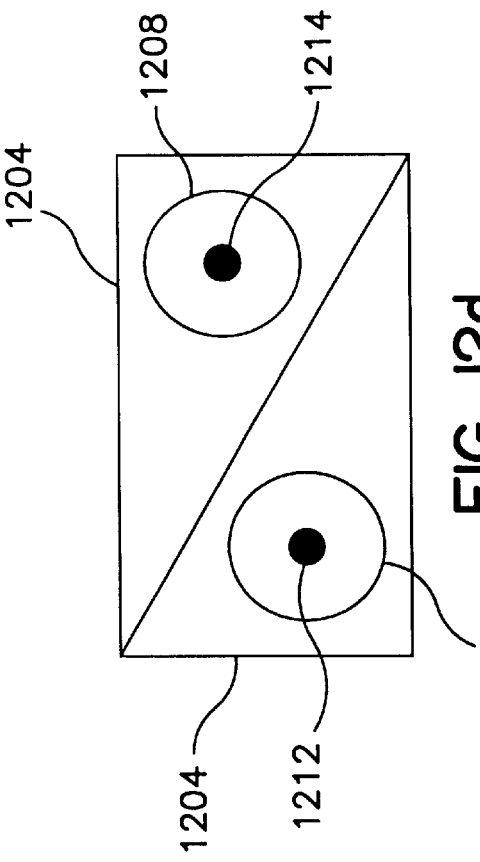
FIG. 12b
FIG. 12d
FIG. 12a
FIG. 12c

OPTOELECTRONIC MOUNTING STRUCTURE

CROSS REFERENCE TO RELATED APPLICATIONS

This application is related to the following co-pending applications, each assigned to the Assignee of the present invention.

Application Ser. No. 09/749,279, filed Dec. 26, 2000, entitled "Apparatus For Holding An Optical Element"

Application Ser. No. 09/749,281, filed Dec. 26, 2000, entitled "An Apparatus And Method Of Using Flexible Printed Circuit Board In Optical Transceiver Device" (as amended);

Application Ser. No. 09/749,282, filed Dec. 26, 2000, entitled "Attenuator And Conditioner";

Application Ser. No. 09/749,284 filed Dec. 26, 2000, entitled "Optical Transmitter, Receiver or Transceiver Module";

Application Ser. No. 09/749,285, filed Dec. 26, 2000, entitled "Housing And Mounting Structure";

Application Ser. No. 09/749,286, filed Dec. 26, 2000, entitled "Optical Power Control System"; and Application Ser. No. 09/749,287, filed Dec. 26, 2000, entitled "Process for Coupling Optical Elements to Optoelectronic Devices".

FIELD OF THE INVENTION

This invention relates to an optoelectronic mounting structure that may be used in conjunction with an optical transmitter, receiver or transceiver module.

BACKGROUND OF THE INVENTION

Fiber optics are one of the most important new media for transmitting information. Fiber optics are capable of carrying enormous quantities of voice, data and video traffic on light impulses over hair-thin glass fibers. Fiber optics transmit more information and data over a shorter period of time than circuit-transmission media. For example, optical signals may be transmitted over fiber optics with losses of less than 0.1 dB/km. In sharp contrast, data generally is transmitted over a pair of twisted copper wires with losses of up to 50 dB/km. The capabilities of fiber optics have fundamentally changed communications.

The fiber optics industry has exploded as the Internet and telecommunication field have created a skyrocketing demand for broadband, high-speed pipe lines to carry data. Long-span fiber optic networks of 100 kilometers or more carry bandwidth ranging from 40 to 50 giga bites per second. Similarly, high-speed fiber optics are capable of connecting wide-area networks of approximately 200 kilometers. Also, fiber optics may connect metropolitan networks of 500 meters to 2 kilometers, such as connecting one building to another building. The largest growth area for high-speed fiber optics, however, is connecting distances of less than 300 meters. In this sub-300 meter or short-distance market, fiber optics are used for a wide variety of purposes, including connecting computers within a room and linking routers, switches and transport equipment.

While significant progress has been made in the area of fiber optics, more wide-spread use is dependent upon the availability of a low cost, easy-to-use and efficient (i.e., low loss of light) optical transmitter and receiver module to link fiber optics to various electronic devices and components such as computers and routers. A critical aspect of such a module is the accurate alignment and attachment of the individual optical fibers to the electronic devices that transmit and receive light streams to and from the optical fibers. These electronic devices, known as optoelectronic devices, use optical and electronic technology or optoelectronics to convert electrical signals into optical radiation or light and transmit the radiation into optical fibers. Other optoelectronic devices receive optical radiation from optical fibers and convert it into electrical signals for processing. Accurate alignment and attachment of the individual optical fibers to the optoelectronic devices is essential to achieving a good and efficient optical connection, one that produces a low loss of light at the interface between the optical fibers and the optoelectronic devices.

A known method for precisely coupling optical fibers to optoelectronic devices is active alignment. Specifically, a photo-detector is placed at one end of an optical fiber, and an optoelectronic device, such as a vertical cavity surface emitting laser, is placed near the other end of the optical fiber. After turning on the laser, the optical fiber is manipulated manually around the light-emitting surface of the laser until the photo-detector detects the maximum amount of optical radiation as indicated by an output electrical signal. Similarly, a photo-detector can be actively coupled to an optical fiber by transmitting laser light into one end of an optical fiber and manually adjusting the position of the other end of the optical fiber relative to the photo-detector until the detector receives the maximum amount of optical radiation.

Actively aligning an array of optical fibers to an array of optoelectronic devices is not practical because the dimensions of an optoelectronic device and the cross-section of an optical fiber are small and multiple dimensions of rotation and translation motion must be controlled. The active alignment process to connect even a single optical fiber strand to an optoelectronic device is usually time-consuming and requires knowledge, skill and expertise. The active alignment process is particularly laborious and time-intensive when a number of optical fibers must be individually aligned to an array of optoelectronic devices. This process requires a variety of relatively complex and costly components that significantly increase the fabrication costs to produce precisely aligned optical devices. Moreover, during the active alignment process, optoelectronic devices emit a significant amount of optical power and energy. The heat generated by the devices can produce thermal strain that may cause the optical fibers and the optoelectronic devices to be misaligned.

Various passive alignment techniques have been developed, such as the use of guide pins and holes, to attempt to provide fast, easy and simultaneous alignment and attachment of an array of optical fibers to optoelectronic devices. Passive alignment typically indicates a technique for aligning a laser and an optical fiber that does not require the laser to be turned on during the alignment process; whereas an "active" technique requires the laser to be turned on. However, these passive alignment techniques often do not provide a precision coupling of the optical fibers to optoelectronic devices.

Accordingly, there is a need in the art to provide a method and apparatus for precise, fast and easy alignment and attachment of optical fibers to optoelectronic devices, which may be mounted on a circuit board. In addition, there is a need in the art to provide an inexpensive method and apparatus for aligning and attaching optical fibers to optoelectronic devices so that the method and apparatus are suitable for mass production. Finally, there is a need in the art for a small apparatus coupling optical fibers to optoelectronic devices so that the apparatus can easily be mounted on a circuit board.

SUMMARY OF THE INVENTION

In view of the above-stated disadvantages of the prior art, an object of the present invention is to provide an optoelectronic mounting structure that may be used in conjunction with an optical transmitter, receiver or transceiver module.

Another object of the present invention is to provide an apparatus and process for quickly, easily and precisely aligning and connecting at least one optical fiber to at least one optoelectronic device by using highly precise machinery and adhesive.

Another object of the present invention is to provide an apparatus and process for aligning and connecting at least one optical fiber to at least one optoelectronic device while maintaining a gap between at least one optical fiber and at least one optoelectronic device.

Another object of the present invention is to provide an apparatus and process for quickly, easily and precisely aligning and connecting at least one optical fiber to a wide variety of device(s) or object(s) by using highly precise machinery and adhesive.

Another object of the present invention is to provide an inexpensive method and apparatus for aligning and connecting at least one optical fiber to at least one optoelectronic device so that the method and apparatus are suitable for mass production.

Another object of the present invention is to provide an inexpensive method and apparatus for aligning and connecting at least one optical fiber to a wide variety of device(s) or object(s) so that the method and apparatus are suitable for mass production.

Another object of the present invention is to provide a small apparatus for coupling at least one optical fiber to at least one optoelectronic device so that the apparatus can easily be mounted on a circuit board.

In accordance with the first object of the present invention, an embodiment of an optoelectronic mounting structure comprises: (1) a mounting structure; (2) an array of optoelectronic devices adapted to the mounting structure, the optoelectronic devices having at least a first end; (3) an array of optical elements, the array of optical elements having at least a first end; (4) the first end of the array of optical elements proximate to the first end of the array of optoelectronic devices in such a manner that one or more optical elements is optically aligned to one or more optoelectronic devices; and (5) a heat spreader passing along a surface of a head region of the mounting structure. The mounting structure may be a flexible printed circuit board. Thermal vias or heat pipes in the head region may transmit heat from the mounting structure to the heat spreader. The heat spreader may provide mechanical rigidity or stiffness to the heat region. In another embodiment, an electrical contact and ground plane may pass along a surface of the head region so as to provide an electrical contact path to the optoelectronic devices and limit electromagnetic interference. In yet another embodiment, a window may be formed in the head region of the mounting structure so as to provide access to the heat spreader. Optoelectronic devices may be adapted to the heat spreader in such a manner that the devices are accessible through the window in the mounting structure.

In accordance with other aspects of the present invention, an optical transmitter, receiver or transceiver module is provided that includes a flexible printed circuit board that is bent at an angle, forming a head region, buckle region and main body region. The flexible printed circuit board supports the electrical components and circuitry of the present invention.

An array of optoelectronic devices, a driver or amplifier chip, a photo-detector, conducting lines, and electronic components may be mounted on a first surface of the head region of the flexible printed circuit board. The optoelectronic devices send and or receive light to and from optical fibers. The optoelectronic devices may be mounted on top of a spacer that may be attached to the head region of the flexible printed circuit board. The spacer raises the height of the optoelectronic devices so that they may efficiently communicate with the optical fibers and other electrical components that are mounted on the head region of the flexible printed circuit board. Alternatively, the optoelectronic devices may be mounted on an optoelectronic mounting structure that is accessible through a window in the flexible printed circuit board. When the optoelectronic devices function as emitters for emitting optical signals into optical fibers, they may be oxide-confined vertical cavity surface emitting lasers; if the optoelectronic devices function as receivers for receiving optical signals from optical fibers, they may be photo-detectors formed on a semiconductor chip. The driver or amplifier chip modulates and drives the optoelectronic devices. An optical power control system may monitor, regulate and stabilize the temperature, power and wavelength of the optoelectronic devices. Additionally, an attenuator may improve the performance of the optoelectronic devices by attenuating the optical energy emitted from the devices. Similarly, a conditioner may improve the performance of the optical fibers by conditioning the launch of the optical energy into the fibers.

The remaining electrical components and circuitry of the optical module may be located on the main body region of the flexible printed circuit board.

The buckle region of the flexible printed circuit board, the region connecting the main body region and head region, absorbs any stress that may occur in connecting a fiber optic cable to the present invention and assists in providing alignment between the optical fibers and optoelectronic devices.

A first ferrule, packaging an array of optical fibers, is mounted on top of the array of optoelectronic devices on the first surface of the head region of the flexible printed circuit board. Highly precise machinery optically aligns aligns the array of optical fiber in the first ferrule to the array of optoelectronic devices. A gap or interstitial space is established between a second end of the first ferrule and a top surface of the optoelectronic devices. Optical adhesive is dispensed in the space or gap between the first ferrule and the optoelectronic devices so as to maintain the precise axial alignment of the array of optical fibers to the array of optoelectronic devices. The optical adhesive provides a optically transparent and stable medium between the optoelectronic devices and the fibers.

After the optical adhesive is cured, a dam may be formed on the first surface of the head region of the flexible printed circuit board. A second adhesive is dispensed inside the dam, and the second adhesive further mechanically stabilizes the first ferrule to the flexible printed circuit board. The second adhesive also protects the circuitry in the immediate vicinity of the optical fibers and optoelectronic devices. For airtight sealing of the optical module, the surface area of the second adhesive may be covered with a third layer, such as a gel silicon resin.

After the first ferrule is firmly attached to the head region of the flexible printed circuit board, the circuit board is wrapped around and attached to a circuit board mounting structure with an adhesive.

A housing snaps or otherwise mounts with screws, adhesives or other means onto a first end of the circuit board mounting structure, enclosing the head region of the flexible printed circuit board along with the first ferrule that is mounted on the head region. The first ferrule fits inside a longitudinal cavity extending from a first end of the housing to a second end of the housing. Ridges inside the longitudinal cavity grab and hold the first ferrule in place.

In operation, a fiber optic cable from an external system is brought in proximity to the housing to create an optical connection. A second ferrule is located at one end of the fiber optic cable, and the second ferrule is designed to mate with the second end of the housing. The second ferrule is inserted into the second end of the housing and ridges in the housing's longitudinal cavity engage and hold the second ferrule in place. Once inside the longitudinal cavity, the second ferrule mates with the first ferrule by engaging guide pins located on a front end of the first ferrule with guide holes located on a front end of the second ferrule. As a result, the array of optical fibers packaged in the two ferrules are axially aligned. Upon mating the ferrules together, light may be transmitted from the fiber optic cable through the two ferrules and to the optoelectronic devices that are adapted to the flexible printed circuit board. The optoelectronic devices convert the light into electrical signals for processing and vice versa.

A further significant aspect of the present invention involves a process by which the first ferrule is aligned and connected to the array of optoelectronic devices, according to a preferred embodiment of the invention. A process of aligning and connecting the first ferrule to the array of optoelectronic device comprises the following steps:

1. Aligning the optical fiber(s) packaged in the first ferrule with the optoelectronic device(s) so that each optical fiber is optically aligned to a corresponding optoelectronic device(s);
2. Depositing optical adhesive on a top surface of the optoelectronic device(s);
3. Placing the first ferrule on top of the optical adhesive while maintaining the alignment of step 1;
4. Tacking and curing the optical adhesive; and
5. Forming a dam around the first ferrule that is mounted on the head region of the flexible printed circuit board, dispensing adhesive and curing the adhesive.

Although the above-stated process has been discussed in terms of accurately aligning and attaching the first ferrule to the array of optoelectronic devices, the same process may be used to accurately align and attach a single optical fiber or an array of optical fibers to a single optoelectronic devices or an array of optoelectronic devices. Similarly, the process may be used to accurately align and connect at least one optical element to a wide variety of devices and objects other than optoelectronic devices. The optical element may comprise a lenslet array, diffractive optic array or an optical fiber. For example, the process may be used to connect an optical element to a micro-electromechanical system ("MEMS") or a biological or chemical sample held on a substrate.

BRIEF DESCRIPTION OF THE DRAWINGS

The accompanying drawings, which are incorporated in and constitute a part of the specification, illustrate embodiments of the invention, and together with the general description given above and the detailed description of the embodiments given below, serve to explain the principles of the invention.

FIG. 4 is a diagram of an embodiment of the optical power control system, according to an embodiment of the invention.

FIGS. 6a–6b are diagrams of alternative embodiments of the optical power control system, according to an embodiment of the invention.

FIG. 8 is side-view showing an alternative embodiment of a first ferrule and the head region of the flexible printed circuit board, according to an embodiment of the invention.

FIG. 10 is a three-dimensional view of an embodiment of the housing, according to an embodiment of the invention.

FIGS. 11a–11b are diagrams of an embodiment of an apparatus for holding an optical element, according to an embodiment of the invention.

FIGS. 12a–12d show views of images of optoelectronic devices and images of optical fibers under the high magnification of a split-field microscope.

DETAILED DESCRIPTION

I. Introduction

Figure 1:
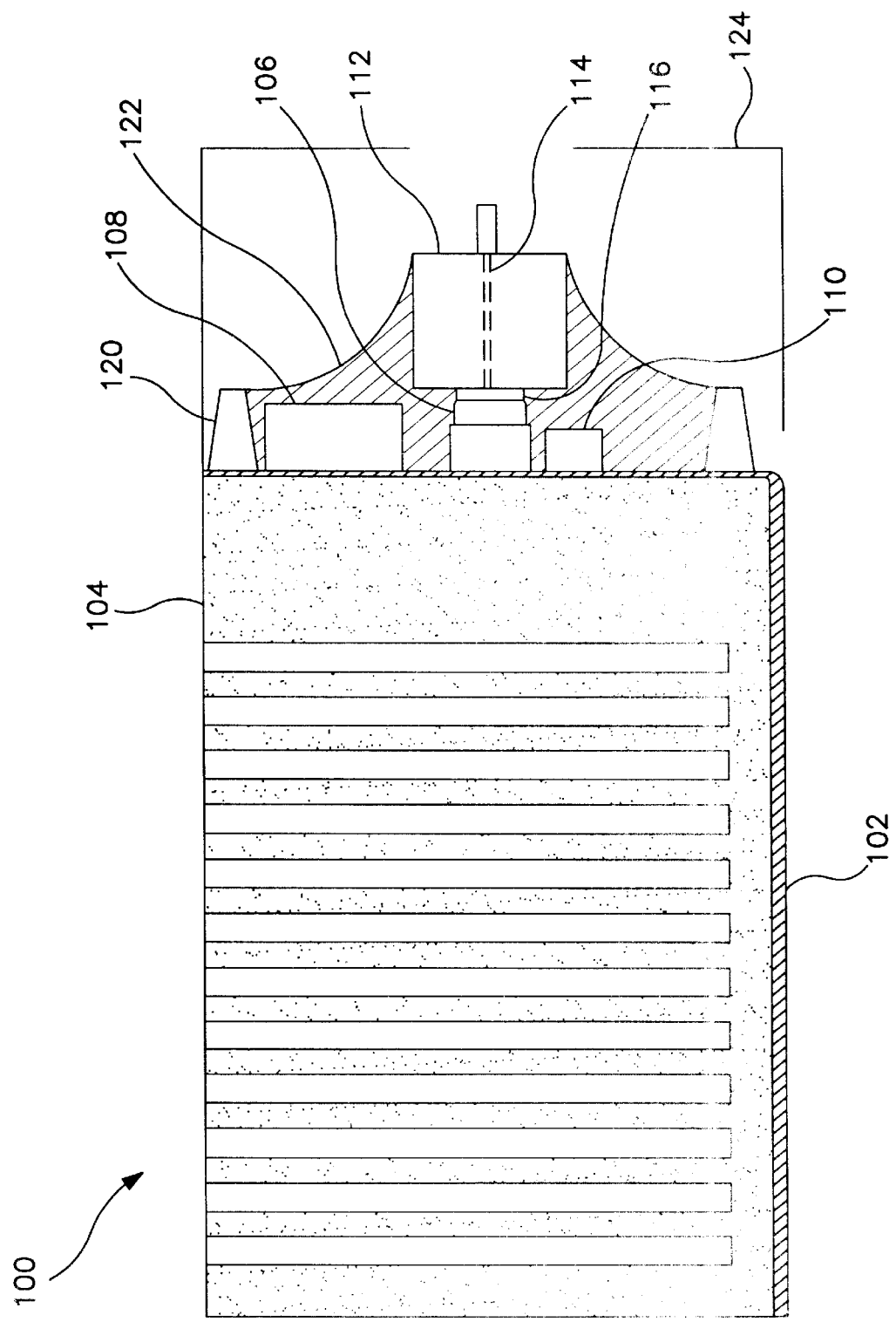
FIG. 1 is perspective view of an embodiment of the invention.

The following embodiments will be described in the context of an optical transceiver, receiver or transceiver module and a method of making the same. Those skilled in the art, however, will recognize that the disclosed methods and structures are adaptable for broader applications. If the same reference numeral is repeated with respect to different figures, it refers to the corresponding structure in each figure.

With reference to FIG. 1, an optical transmitter, receiver or transceiver module 100 is depicted, according to an embodiment of the invention. The optical module 100 comprises a flexible printed circuit board 102 that wraps around and attaches to a circuit board mounting structure 104. The flexible printed circuit board 102 functions to support the electrical components of the optical module 100, such as an array of optoelectronic devices 106, a driver or amplifier chip 108, and a photo-detector 110. A first ferrule 112, packaging an array of optical fibers 114, is mounted on top of the array of optoelectronic devices 106 in such a manner that one or more of the optical fibers in the array is optically aligned to one or more of the optoelectronic devices.

Prior to mounting the first ferrule 112 on the array of optoelectronic devices 106, a first adhesive 116 is dispensed on a top surface of the array of optoelectronic devices 106. The first adhesive 116 functions to maintain the precise axial alignment between the array of optical fibers 114 and array of optoelectronic devices 106. The first adhesive 116 also functions to produce a high, optical coupling efficiency between the optical fibers 114 and optoelectronic devices 106. Additionally, the first adhesive 116 functions to mechanically stabilize the first ferrule 112 to the optoelectronic devices 106.

To further mechanically stabilize the first ferrule 112 to the flexible printed circuit board 102, a dam 120 may be formed on the flexible printed circuit board 102 and filled with a second adhesive 122. An housing 124 is attached to the circuit board mounting structure 104, surrounding and enclosing the first ferrule 112 that is connected to the flexible printed circuit board 102.

Figure 2:
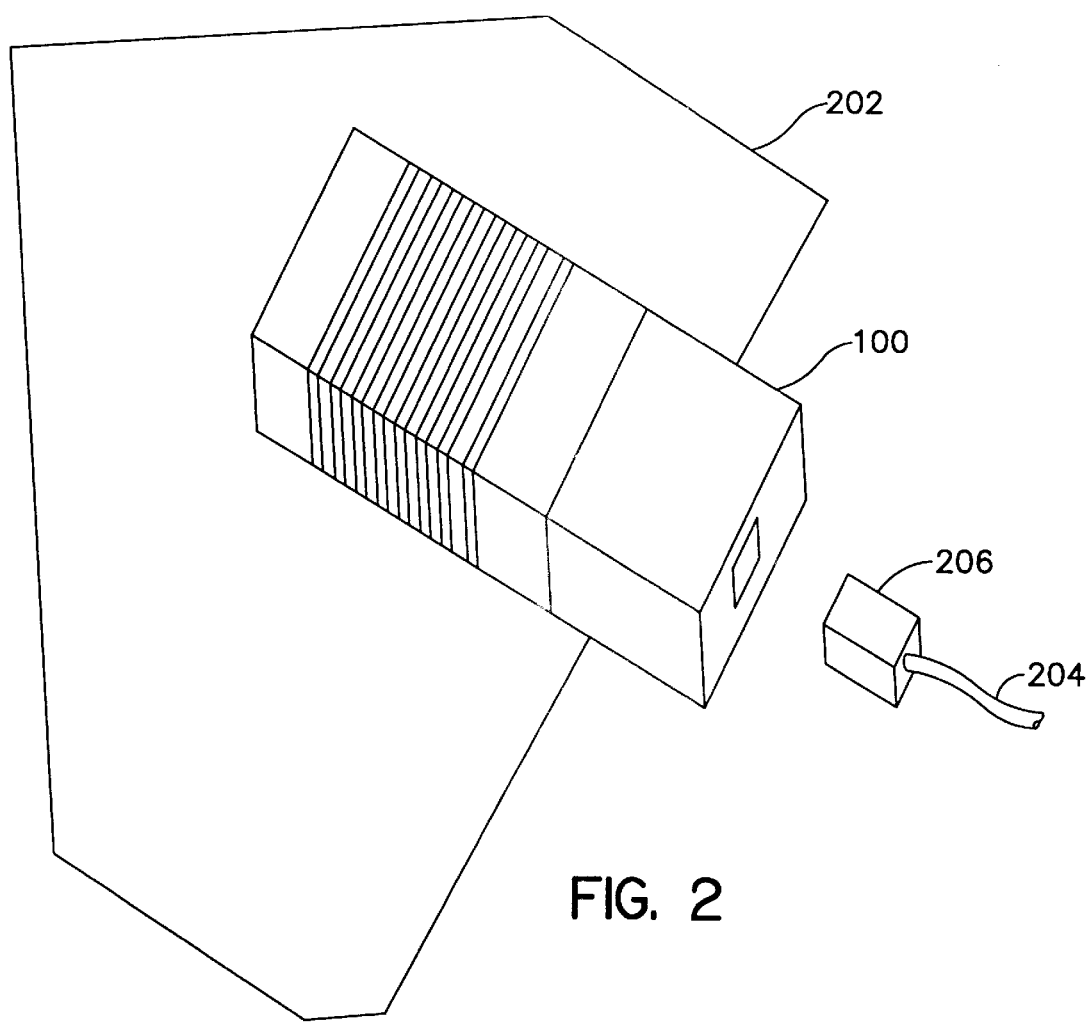
FIG. 2 shows a perspective view of an embodiment of the invention mounted on the edge of a circuit board.

In an illustrative embodiment, an optical transmitter or receiver module 100 is mounted on a second circuit board 202, as depicted in FIG. 2. The optical module, however, does not have to be mounted at the board's edge. The optical module may be mounted anywhere on the circuit board so long as there is room for connecting the optical module to the external environment. In operation, the optical module 100 is connected to the external environment by connecting a fiber optic cable 204 to the optical module 100. This is accomplished by plugging a second ferrule 206 that is attached to one end of a fiber optic cable 204 into the optical module 100. Once the second ferrule 206 is plugged into the optical module 100, the module 100 is optically connected to the fiber optic cable 204. Accordingly, if the optical module 100 functions as a transmitter, the optical module 100 receives electrical signals from the second circuit board 202, converts the electrical signals into optical signals, and transmits the optical signals into the fiber optic cable 204. On the other hand, if the optical module 100 functions as a receiver, the optical module 100 receives optical signals from the fiber optic cable 204, converts the optical signals into electrical signals and transmits the electrical signals to the second circuit board 202.

II. Flexible Printed Circuit Board

Figure 3A:
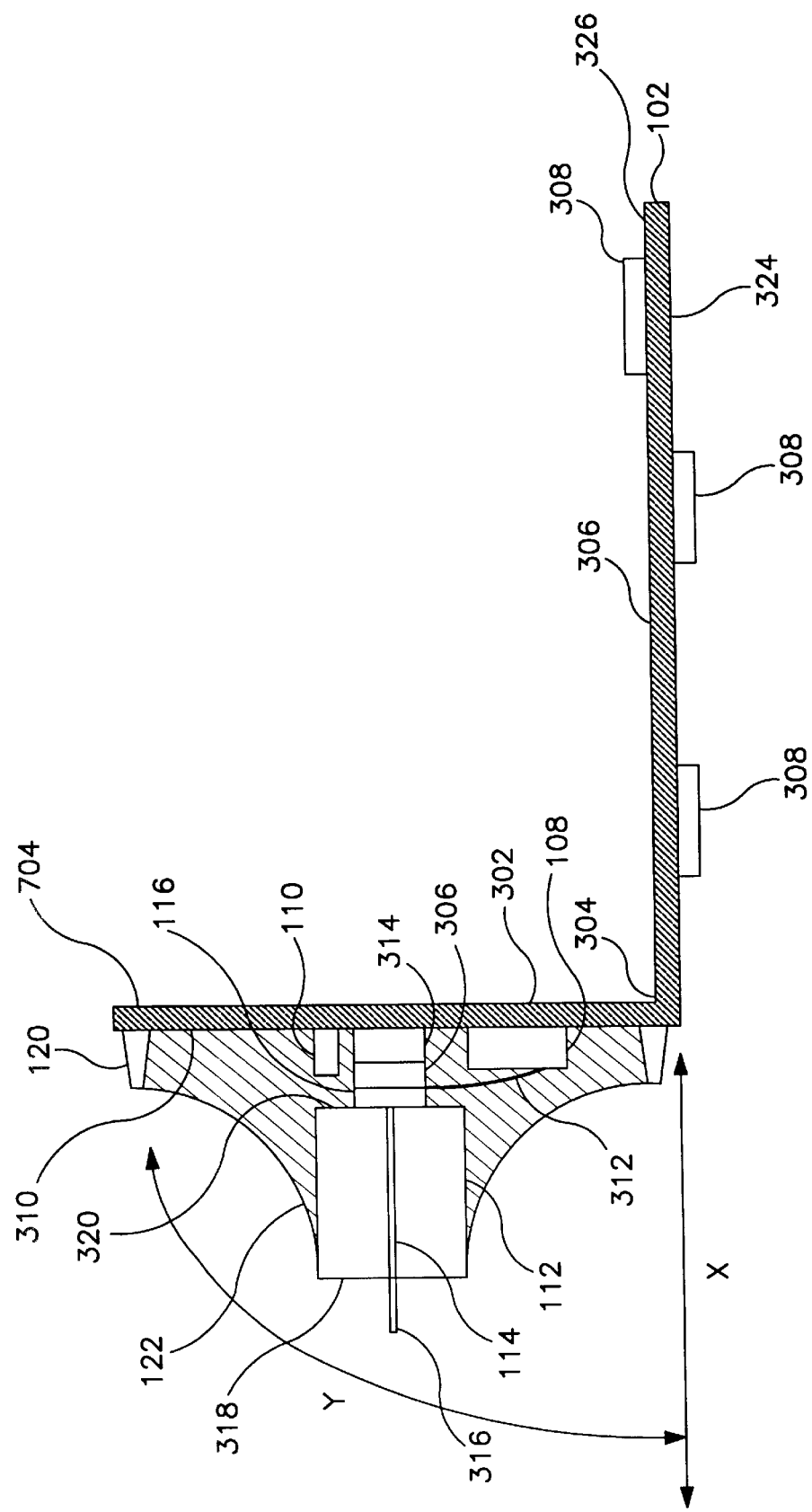
FIGS. 3a–3b are diagrams of cut-away-side views of the flexible printed circuit board, according to an embodiment of the invention.
Figure 3B:
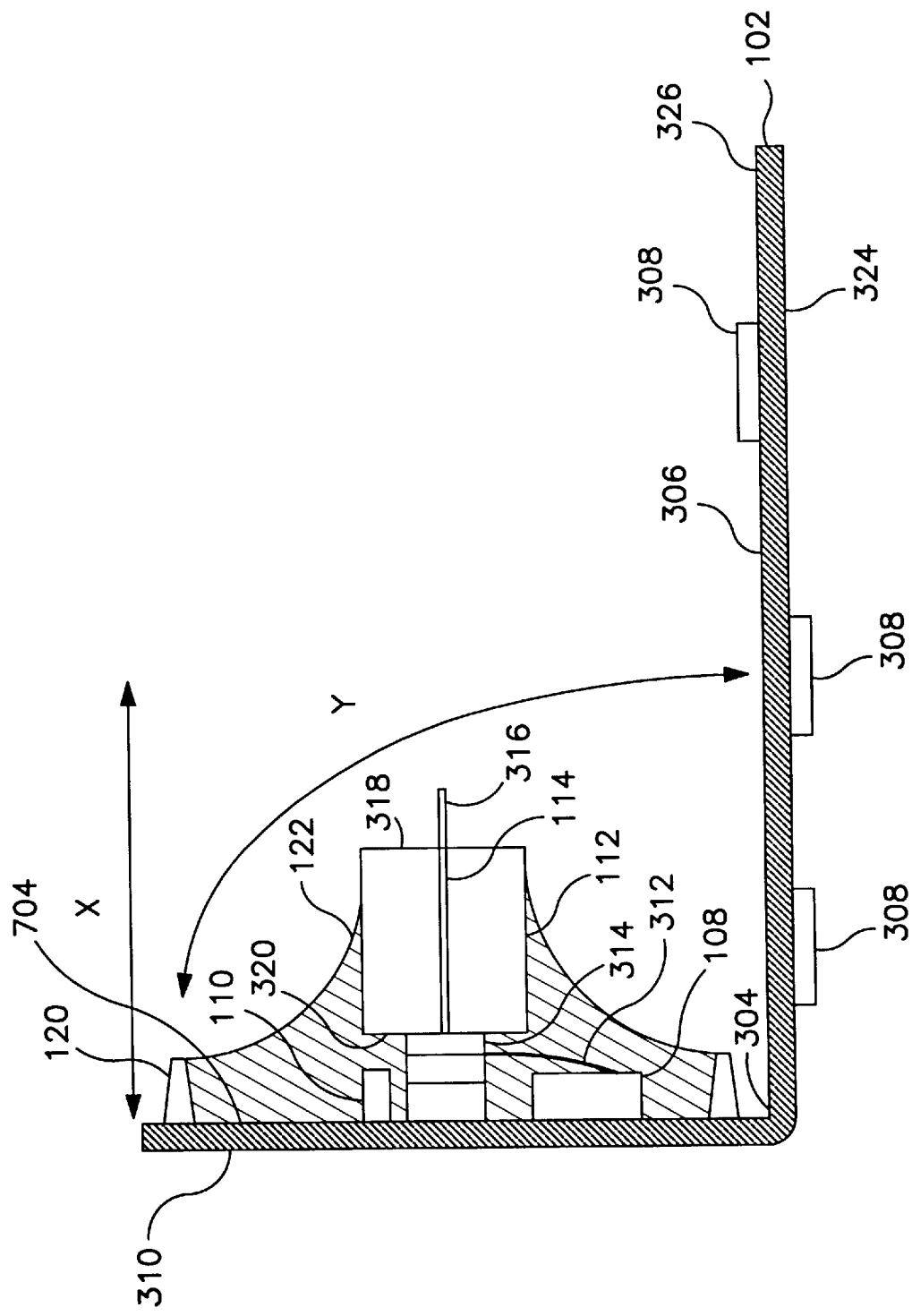

The flexible printed circuit board 102 is now described in further detail. Specifically, FIG. 3a is a cut-away-side view of an embodiment of the flexible printed circuit board 102. The flexible printed circuit board may be bent or folded in any direction, and another embodiment of the flexible printed circuit board is shown in FIG. 3b. The flexible printed circuit board 102 is thin, rectangular and flexible with various edge contours, and it is composed of flexible metal layers that are sandwiched between insulating layers. The entire flexible printed circuit board may be composed of this multi-layered structure. In addition to supporting the electrical components and circuitry of the optical module 100, the flexible printed circuit board 102 also provides stress relief when connecting the optical module 100 to an external source and aids in maintaining the precise alignment of the optoelectronic devices 106 with an the optical fibers 114.

The flexible printed circuit board 102 is bent in the "Y" direction to form a head region 302, a buckle region 304 and a main body region 306. The head region 302 may function to support the key electrical components and other elements of the optical module 100, such as the optoelectronic devices 106 and driver or amplifier chip 108. The main body region houses a plurality of electronic components 308 and a plurality of electronic circuitry of the optical module 100.

The buckle region 304 is that area of the flexible printed circuit board 102 that connects the head region 302 to the main body region 306.

Each region of the flexible printed circuit board is described in detail below.

A. Head Region

The head region 302 of the flexible printed circuit board 102 is now described in detail, and it is shown in FIG. 3a or FIG. 3b. The head region 302 is composed of the same multi-layered structure as the other regions of the flexible printed circuit board 102. The head region 302 is orientated in the "Y" direction, and the head region 302 may be on a plane that is substantially perpendicular to the main body region 306 of the flexible printed circuit board 102, as shown in FIG. 3a or FIG. 3b.

The head region 302 is orientated in the "Y" direction so that the optical fibers 114 packaged in the first ferrule 112 are optically aligned with the optical fibers 114 packaged in the second ferrule 206. As shown in FIG. 3a or FIG. 3b, the head region 302 of the flexible printed circuit board 102 may function to support the key electrical components of the optical module 100 such as the driver or amplifier chip 108.

The flexible printed circuit board performs the function of changing the plane on which the signals are received. Specifically, the signals are received by the flexible printed circuit board in the "X" direction from the first ferrule 112 that is optically connected to the optoelectronic devices 106, which are adapted to the head region 302 of the flexible printed circuit board 102. The signals then flow in substantially the "Y" direction in the head region 302 of the flexible printed circuit board 102. The signals then change planes, as they pass from the head region 302 through the buckle region 304 and to the main body region 306 of the flexible printed circuit board 102, as shown in FIG. 3a or FIG. 3b. The signals flow in the "X" direction in the main body region. Advantageously, by changing the plane on which the signals travel, the flexible printed circuit board functions to efficiently communicate with both the fiber optical cable attached to the optical module and an external circuit board upon which the optical module is mounted.

1. Optoelectronic Devices

One board-level component of the head region 302 may be the array of optoelectronic devices 106. The array of optoelectronic devices 106 may be adapted approximately in the center of a first surface 310 and/or the second surface 704 of the head region 302, as shown in FIG. 3a or FIG. 3b. The array of optoelectronic devices 106 may be a one-dimensional, two-dimensional or a multi-dimensional array of optoelectronic devices 106.

The array of optoelectronic devices 106 may be various types of devices such as edge-emitting lasers, light-emitting diodes ("LEDs"), vertical cavity surface emitting lasers (VCSELs), other surface emitting devices or photo-detectors. The optoelectronic devices 106 may also be integrated devices combining one or more devices such as the combination of VCSELs and transistors or photo-detectors and transistors (or VCSELs, photo-detectors and transistors). The optoelectronic devices 106 may also be a heterogeneous array where some of the array elements are emitters and some are detectors.

If the optoelectronic devices 106 are VCSELs, the optical module 100 functions as a transmitter, sending optical signals into the array of optical fibers 114 that are packaged in the ferrule.

If the optoelectronic devices 106 are photo-detectors formed on a semiconductor chip, the optical module 100 functions as a receiver for receiving optical signals from the array of optical fibers 114 packaged in the first ferrule 112.

In an embodiment, the optoelectronic devices 106 are oxide-confined VCSELs. Advantageously, oxide-confined VCSELs operate at higher speeds and have lower threshold currents than non-oxide VCSELs, such as ion-implant VCSELs. Additionally, oxide-confined VCSELs are stable VCSELs, exhibiting uniform power and wavelength performance over varying temperature ranges. This advantageously would allow the module to perform for longer a duration and high degree of accuracy. Moreover, it is contemplated that use of oxide VCSELs would obviate the need for a feedback loop, as hereafter described. Moreover, oxide-confined VCSELs allow the fabrication of highly uniform arrays, enabling multi-channel, parallel optic applications.

Lastly in another embodiment, a micro-electromechanical system ("MEMS") array, a micro-pipette array or a biological or chemical sample held on a substrate may be used in place of the array of optoelectronic devices 106.

2. Driver or Amplifier Chip

Another board-level component of the head region 302 of the flexible printed circuit board 102 may be the driver or amplifier chip 108, as shown in FIG. 3a or FIG. 3b. Specifically, a driver or amplifier chip 108 may be adapted next to the array of optoelectronic devices 106 on the first surface 310 and or the second surface 704 of the head region 302 of the flexible printed circuit board 102, as shown in FIG. 3a or FIG. 3b. In another embodiment, the driver or amplifier chip 108 may be adapted to the main body region of the flexible printed circuit board.

Where the optoelectronic devices 106 are VCSELs, a driver chip is used, and it functions to drive and modulate the VCSELs. Where the optoelectronic devices 106 are photo-detectors, then an amplifier chip is used, and it amplifies the electronic signals received from photo-detectors. Wire bonds 312 or any other suitable means such as plating, welding, tape-automated bonding or the use of flip-chip technology may be used to connect the driver or amplifier chip 108 to the optoelectronic devices 106, as shown in FIG. 3a or FIG. 3b. The driver or amplifier chip 108 may be monolithically formed on a semiconductor chip or integrated with the array of optoelectronic devices 106 as a hybrid circuit.

3. Optical Power Control System

Still another board-level component of the head region 302 of the flexible printed circuit board 102 may be an optical power control system. During operation, temperature changes across an array of VCSELs and other factors can cause the power and wavelength of the VCSEL array to change. The optical power control system functions to stabilize the performance of the array of VCSELs over changing conditions. Specifically, if the array of optoelectronic devices 106 are transmitters such as VCSELs, an optical power control system is adapted proximate to the array of optoelectronic devices 106 on the first surface 310 of the head region 302 of the flexible printed circuit board 102.

FIG. 4 is an embodiment of the optical power control system. The optical power control system utilizes the photo-detector 110 (or alternatively a light-pipe) to measure the optical output power of a VCSEL in an array of VCSELs. In an embodiment of the invention, if the optoelectronic devices 106 are VCSELs, the optical power control system measures the power of a thirteenth VCSEL 404 in the array of VCSELs. However, the optical power may be measured by any other suitable VCSEL in the array of VCSELs. The photo-detector's measurement is used to adjust the electrical power input to each individual VCSEL. This is accomplished by a feedback loop between the photo-detector 110 and the driver chip 108. The driver chip 108 adjusts the laser injection current in response to the feedback, and this results in a stable array of optoelectronic devices.

Figure 5B:
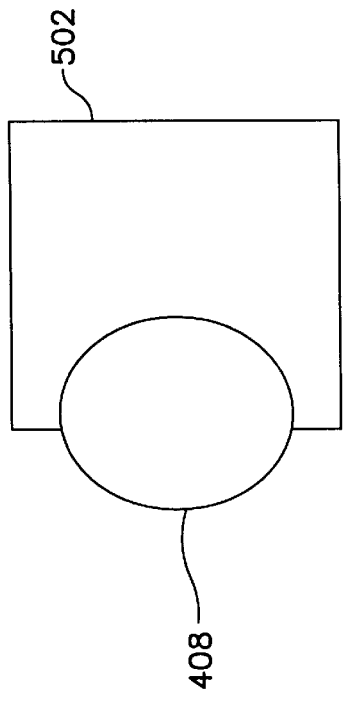
FIGS. 5a–5d are diagrams of different optical beam patterns on an aperture of a photo-detector, according to an embodiment of the invention.
Figure 5A:
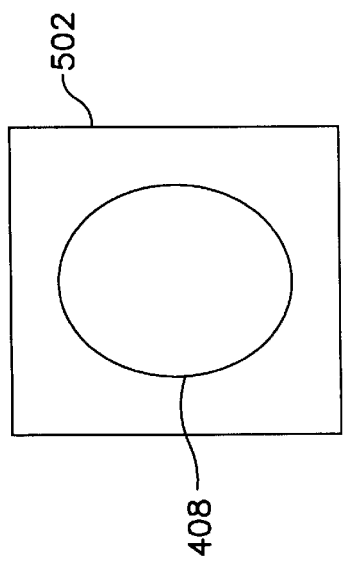
Figure 5D:
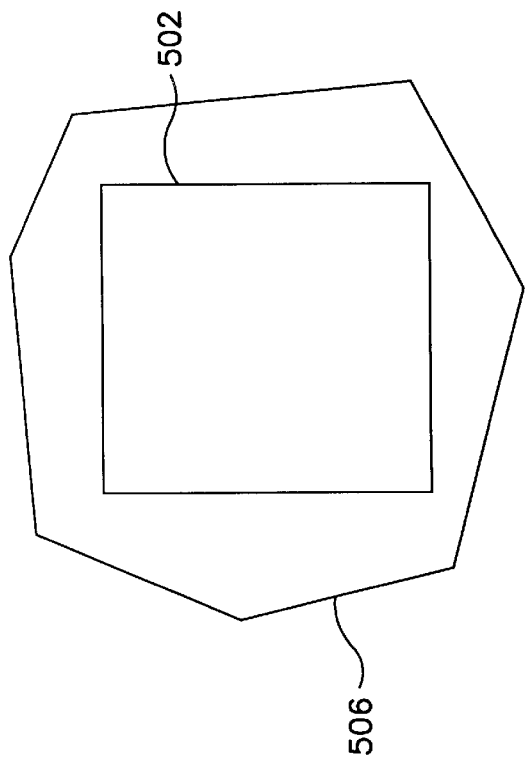
Figure 5C:
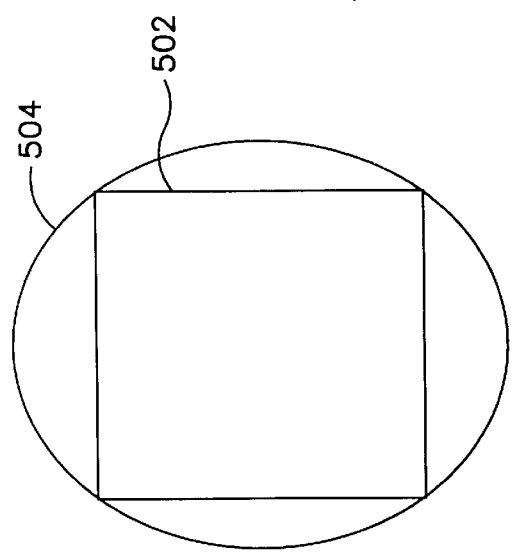

FIGS. 5a–5d are diagrams of different optical beam patterns on apertures of photo-detectors. A critical aspect of a robust optical power control system is the tracking ratio. The tracking ratio is the ability of the photo-detector 110 to track and capture the optical beam 408 so that the photo-detector 110 accurately measures the amount of power emitted by the VCSEL array. In the ideal situation, the optical beam 408 is fully captured by the photodetector's aperture 502 as shown in FIG. 5a. This allows the photo-detector 110 to precisely measure the power of the beam. However, temperature changes, aging, and other factors during operation can cause the optical beam 408 to become misaligned, as shown in FIG. 5b. Since the photo-detector's aperture 502 captures less of the optical beam 408, the photo-detector is unable to accurately measure the beam's power. This causes the optical power control system to improperly adjust the power of the VCSEL array. Similarly as shown in FIG. 5c, changes in laser injection current and other factors can create a diverged or enlarged optical beam 504. Again, the photo-detector's aperture 502 detects less power, causing inaccurate adjustments to the power output of the VCSEL array.

Advantageously, the present invention improves the tracking ratio under changing conditions. The present invention accomplishes this task by adapting a reflector/scatterer 410 to a second end of the first ferrule 320, as shown in FIG. 4. An optical path may be created from the thirteenth VCSEL 404 to the reflector/scatterer 410 and onto the photo-detector 110. The geometry and surface roughness of the reflector/scatterer 410 produces a beam pattern 506 that is highly uniform, scattered and larger than the photo-detector's aperture, as shown in FIG. 5d. This uniform and scattered beam pattern 506 has a high tolerance for alignment and divergence changes. Accordingly, it is less sensitive to temperature changes, aging and other issues. Advantageously, this allows the photo-detector 110 to accurately measure the power of the optical beam 408 under varying conditions and environmental circumstances. For example, temperature changes across the VCSEL array may change the optical beam's pattern, alignment and divergence, and this impacts the photo-detector's 110 ability to accurately measure power. However, the highly scattered and uniform beam pattern produced by the reflector/scatterer 410 is significantly less sensitive to temperature changes. This allows the photo-detector 110 to capture the optical beam 504 and accurately measure power. The novel beam pattern produced by the unique reflector/scatterer 410 allows the optical power control system to maintain constant power across the VCSEL array under changing conditions. Consequently, the optical power control system produces a stable and uniform VCSEL array.

In an embodiment, the reflector/scatterer 410 is a conical hole that is coated with a reflecting/scattering coating. The reflective/scattering coating may be gold, titanium, aluminum or other types materials that have the effect of both reflecting and scattering light. The reflector/scatterer 410 may also be an arbitrarily shaped rough surface, sphere, notch, prism or optical element.

Figure 6A:
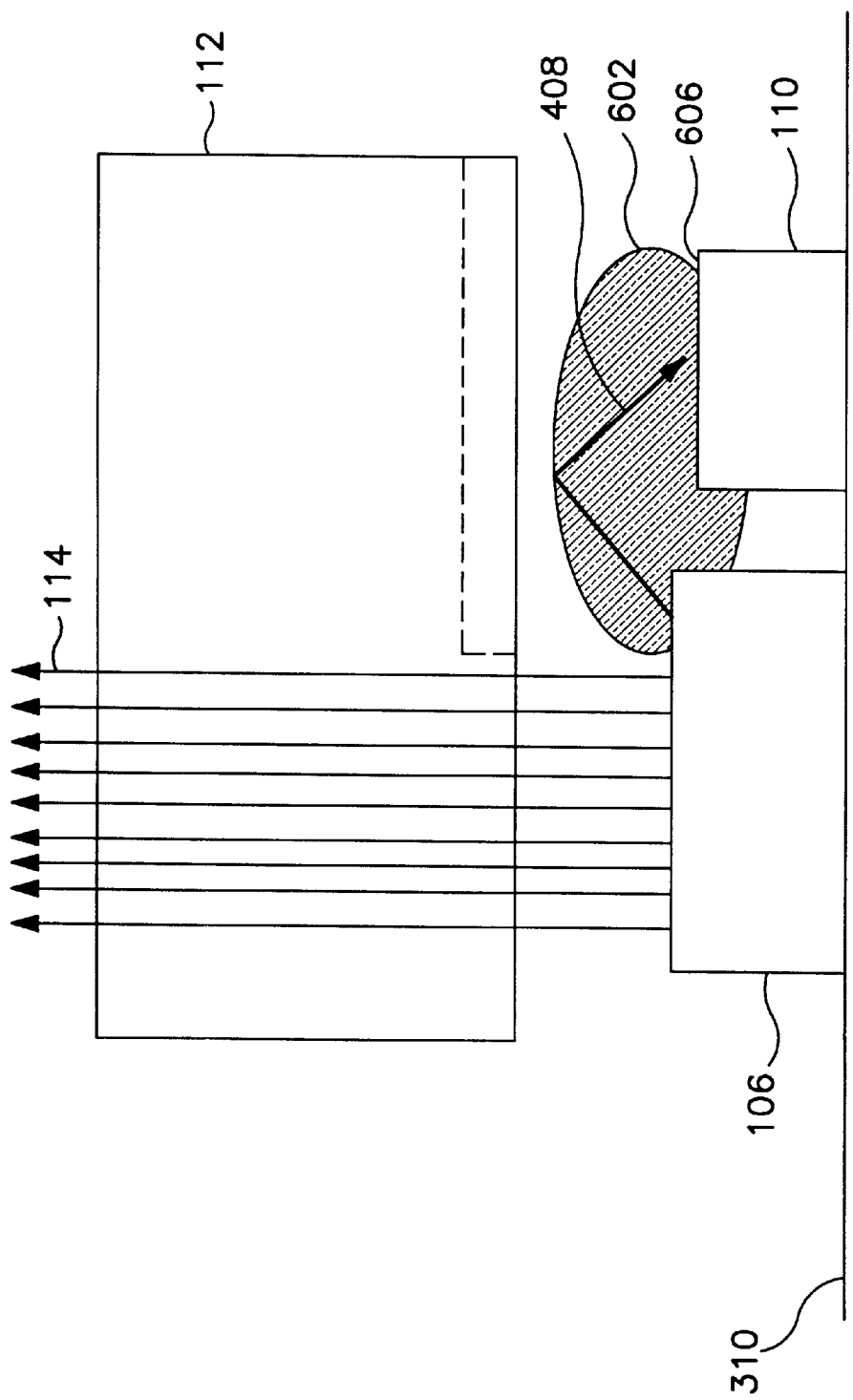

An alternative embodiment of the optical power control system is show in FIG. 6a. A glob top of optical resin 602 is coated with a reflective scatterer and is dispensed on the top surface of the array of optoelectronic devices 106 and a top surface of the photo detector 606. The glob top 602 scatters light in multiple directions, and a portion of the light is detected by the photo-detector 110. The shape and coating of the glob top 602 may be engineered to provide varying amounts of scattering for more uniformity and reflection and thus higher energy transfer. As shown by dashed lines in FIG. 6a, a notch may be cut in the first ferrule 112 to allow room for the glob top of optical resign.

Another embodiment of the optical power control system is show in FIG. 6b. Here, a reflector 608 is formed separately and then adapted to the top surface of the array of optoelectronic devices 106 and to the top surface of the photo detector 606. Similar to the glob top 602, the reflector 608 scatters light in multiple directions, and a portion of the light is detected by the photo-detector 110. The shape and coating of the reflector 608 may be engineered to provide varying amounts of scattering for more uniformity and reflecting and thus higher energy transfer. The reflector may be in the shape of an ellipsoid, three-dimensional conical hole or other shape. It also may be a geometrically-shaped object. In another embodiment, the reflector is adapted to the second end 320 of the first ferrule 112 rather than adapted to the top surface of array of optoelectronic devices 106 and photo detector 606. As shown by dashed lines in FIG. 6a, a notch may be cut in the ferrule to allow room for the glob top of optical resign.

4. Spacer

An additional board-level component of the head region 302 of the flexible printed circuit board 102 may be a spacer 314, as shown in FIG. 3a or FIG. 3b. The spacer 314 may be shaped like a square and may be composed of silicon material. A bottom surface of the spacer 314 may be adapted approximately in the center of the head region 302, as shown in FIG. 3a or FIG. 3b. A top surface of the spacer 314 may serve as a mounting surface for the array of optoelectronic devices 106 when they function as receivers (e.g., photo-detectors). The spacer 314 is optional if the optoelectronic devices 106 function as emitters (e.g., VCSELs). The spacer also may function as a mounting surface for other components such as the first ferrule 112.

The spacer 314 may function to raise the height of the array of optoelectronic devices 106 so as to maximize the optical coupling between the optoelectronic devices 106 and the optical fibers 114, which are packaged in the first ferrule 112. The spacer may function to adjust the length of the wire bonds or other electrical connection means between the array of optoelectronic devices 106 and other components such as the driver or amplifier chip 108. The spacer also may be used to aid in creating a gap between the array of optoelectronic devices 106 and the array of optical fibers that are inside the first ferrule 114.

The spacer 314 also may function to raise the height of the array of optoelectronic devices 106 so that a top surface of the array of optoelectronic devices 106 is approximately on the same plane as the other components, such as the driver or amplifier chip 108, that are adapted on the head region 302, as shown in FIG. 3a or FIG. 3b. Advantageously, by maintaining the optoelectronic devices on the same plane as the other electrical components, the wire bonds 312 between the components on the head region 302 more robust and efficient.

The spacer 314 may be optional if the optoelectronic devices 102 have sufficient height so as to place the second end of the first ferrule 320 at an optimal position above the top surface of the driver or amplifier chip 108. According to a preferred embodiment, a small interstitial space or gap is maintained between the second end of the first ferrule 320 and the top surface of the optoelectronic devices 102. In alternative embodiments, this interstitial gap may be omitted.

In another embodiment, the spacer 314 also may function to create or form a gap between the array of optoelectronic devices 106 and the array of optical fibers. Specifically, the spacer 314 may be adjacent to the array of optoelectronic devices. The top surface of the spacer 314 may be higher than the top surface of the array of optoelectornic devices 106. The top surface of the spacer may be in contact with the second end of the first ferrule 320. Accordingly, this creates or forms a gap between the optoelectronic devices and array of optical fibers packaged in the first ferrule.

5. Optoelectronic Mounting Structure

The electrical components on the flexible printed circuit board 102 generate heat, and an optoelectronic mounting structure 702 may be used to transmit this heat to the circuit board mounting structure 104, as explained below.

Figure 7A:
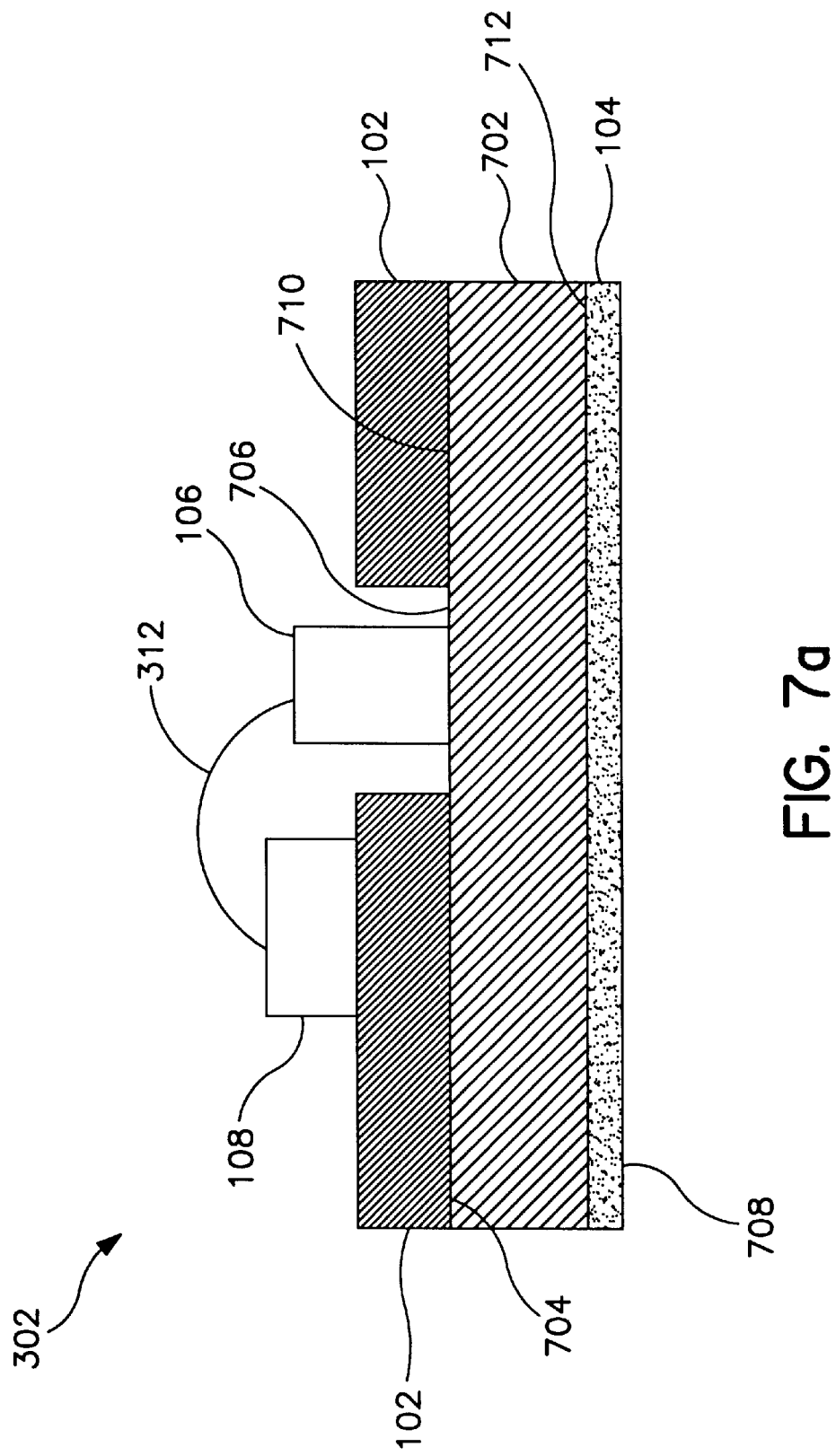
FIGS. 7a–7b are cut-away-side views showing embodiments of a head region of the flexible printed circuit board, according to embodiments of the invention.

FIG. 7a is a cut-away-side view showing an alternative embodiment of the head region 302 of the flexible printed circuit board 102, according to an embodiment of the invention. Specifically, the optoelectronic mounting structure 702 has a first surface 710 and a second surface 712. The first surface 710 of the optoelectronic mounting structure 702 passes along a second surface 704 of the head region 302 of the flexible printed circuit board 102. The second surface 712 of the optoelectronic mounting structure 702 is adapted to an upper surface 708 of the circuit board mounting structure 104 with a compliant adhesive. The optoelectronic mounting structure may be copper or a similar conductive material. The optoelectronic mounting structure may be coated with gold or other adhesion promotion layers such as nickel. An window 706 may be formed in the head region 302 of the flexible printed circuit board 102 so as to provide access to the optoelectronic mounting structure 702. The array of optoelectronic devices 106 may be mounted in the window 706 directly on top of the optoelectronic mounting structure 702. Accordingly, the optoelectronic mounting structure provides a thermal and an electrical contact area for the optoelectronic devices. Other electrical components, such as the driver or amplifier chip 108 also may be mounted in the window 706 directly on the optoelectronic mounting structure 702.

The optoelectronc mounting structure advantageously 702 dissipates heat generated by the array of optoelectronic devices 106 and other electrical components by spreading the heat and efficiently transmitting it to the circuit board mounting structure 104. The optoelectronic mounting structure 702 also provides an electrical contact path to the optoelectronic devices 106 since the back side of the optoelectronic devices 106 may be gold or copper plated and may be mounted directly to a copper optoelectronic mounting structure 702. Moreover, since the optoelectronic mounting structure 702 may be a solid copper plane, it may acts to limit electromagnetic interference. Acting as a ground plane for the optoelectronic devices 106, the optoelectronic mounting structure 702 provides electrical shielding by containing any electrical fields that may exist so that the electrical fields do not radiate and create cross talk. The optoelectronic mounting structure 702 additionally may provide a stable mounting surface for the optoelectronic devices 106, and it may function to raise or change the height of the electrical components. The optoelectronic mounting structure 702 also provides mechanical rigidity to the head region 302 of the flexible printed circuit board 102. This mechanical rigidity stiffens the head region 302 and advantageously aids in the assembly process.

Figure 7B:
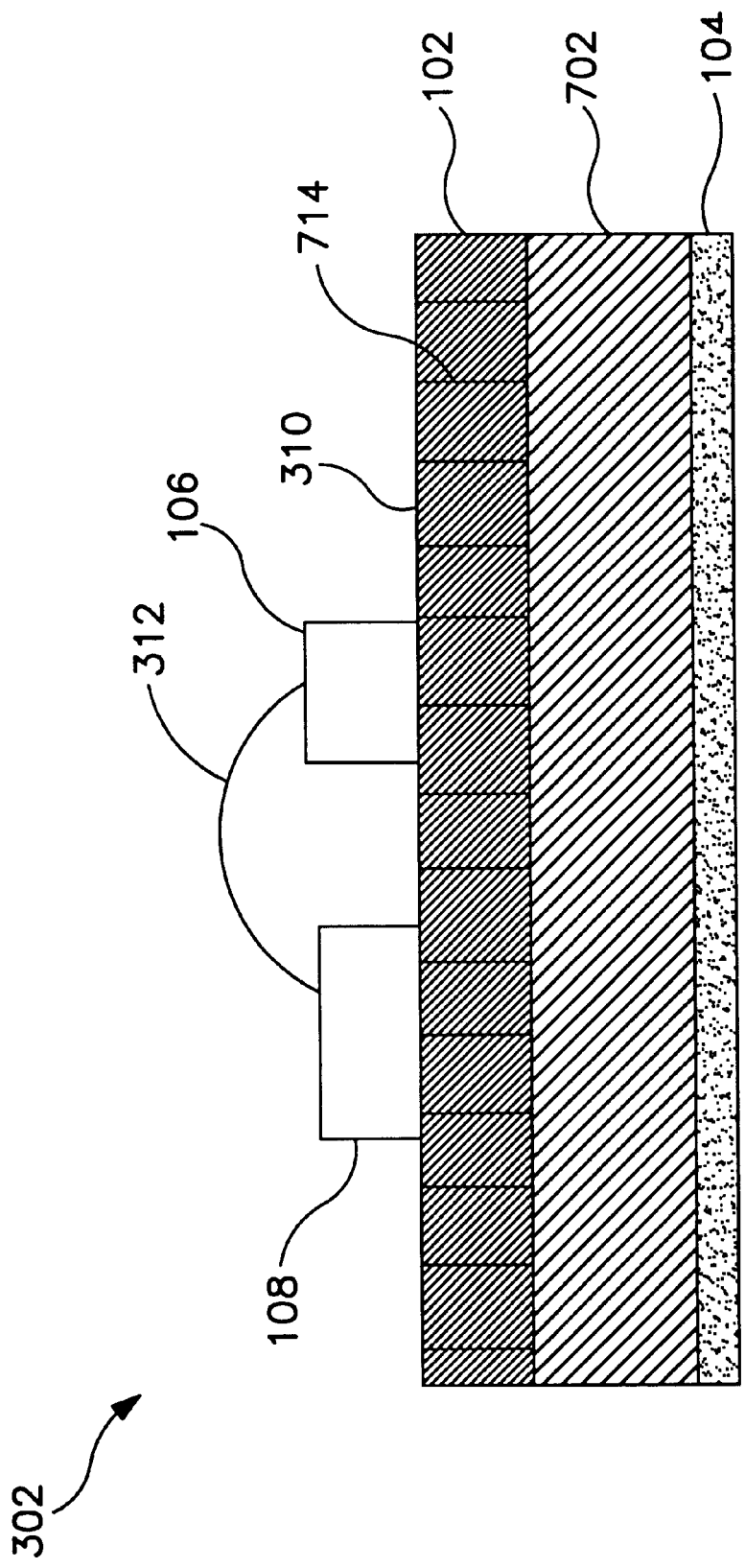

FIG. 7b is a cut-away-side view showing an alternative embodiment of the head region 302 of the flexible printed circuit board 102, according to an embodiment of the invention. Specifically, openings 714 in the head region 302 of the flexible printed circuit 102 board may function to dissipate heat to the optoelectronic mounting structure 702. The openings 714 may be heat pipes, thermal vias or similar structures that transmit heat. The openings 714 may be formed in the head region 302 so as to provide access to the optoelectronic mounting structure 702. Electrical components, such as the array of optoelectronic devices 106 and the driver or amplifier chip 108, may be mounted on the first surface of the head region 302. Heat generated by these electrical components may pass through the openings 714 and to the optoelectronic mounting structure 702. The optoelectronic mounting structure 702 dissipates or spreads this heat to the circuit board mounting structure 104.

6. Ferrule

The optical module 100 may include the first ferrule 112, as shown in FIG. 3a or FIG. 3b. The first ferrule is mounted on the head region 302 of the flexible printed circuit board 102. More specifically, the second end of the first ferrule 320 is mounted on the top surface of the array of optoelectronic devices 106. The first ferrule 112 is precisely aligned and attached directly above the active region of the array of optoelectronic devices 106 so that a high coupling efficiency (low loss of light) is achieved. In other words, each optical fiber 114 in the first ferrule 112 is accurately aligned to a corresponding individual optoelectronic device 106 so that the array of optical fibers 114 inside the first ferrule 112 is optically aligned with the array of optoelectronic devices 106. The precise alignment and attachment of the first ferrule 112 to the array of optoelectronic devices 106 is accomplished by using highly precise machinery and adhesive, and this novel process is explained below.

The first ferrule 112 may comprise a rectangular ferrule. The first ferrule 112 packages an array of optical fibers 114, extending from a first end 318 of the first ferrule 112 to a second end 320 of the first ferrule 112. Two alignment pins 316 may be adapted to the first end 318 of the first ferrule 112. The alignment pins function to mate the first ferrule 112 to a second ferrule 206. Alternatively, two alignment pin holes may be adapted to the first end 318 of the first ferrule 112 in place of the two alignment pins 318. The alignment pin holes function to mate the first ferrule 112 to a second ferrule 206.

FIG. 8 is a side-view showing an alternative embodiment of the first ferrule 112 and the head region 302 of the flexible printed circuit board 102, according to an embodiment of the invention. Costs are reduced by using a smaller optoelectronic device 106, as shown in FIG. 8. A notch 802 exists at the second end of the first ferrule 320 so that there is sufficient room for wire bonding between the optoelectronic devices 106 and driver or amplifier chip 108. Advantageously, the notch 802 allows positioning the driver chip or amplifier chip 108 in close proximity to the smaller optoelectronic devices 106. Therefore, the notch 802 obviates the need for long wire bonds to connect the optoelectronic devices to the driver or amplifier chip.

In another embodiment, an array of optical elements may be used in place of the array of optical fibers 114. The optical element may comprise a lenslet array, diffractive optic array, a lens, filter, pipette, capillary tube or optical fibers. Also, the optical element does not have to be optical as, for example, in embodiments of the present invention in which biological or chemical analysis is performed. The optical element array may be a one-dimensional, two-dimensional or multi-dimensional array of optical elements.

In contrast to a single optical element or fiber, an array of optical elements or fibers introduces engineering, design, assembly and packaging complexity. This complexity was taken into account in embodiments of the invention. For example, an array of optical elements generates more heat and electromagnetic interference that a single optical element, and this must be considered in all aspects of making and using the device. Also, unlike aligning a single optical element to an optoelectronic device, aligning an array of optical elements to an array of optoelectronic devices is considerably more difficult and complex. Moreover, an array of optical elements can more readily become effected by electrical or optical cross-talk since the optical elements are closely coupled. Therefore, the array is highly subject to signal degradation, and design limitations must be made to take these factors into account. Additionally, working with an array rather than a single optical fiber requires developing new tools and techniques for various manufacturing aspects such as precision alignment and eye-safety. Such tools and techniques were developed specifically for embodiments of this invention. In summary, for these and other reasons, an array of optical elements introduces engineering, design, assembly and packaging complexity that is simply not present with a signal optical element, and this added complexity was taken into account in embodiments of the invention.

7. First Adhesive

Prior to mounting the first ferrule 112 on top of the array of optoelectronic devices 106, a first adhesive 116 is dispensed on the top surface of the array of optoelectronic devices 106, as shown in FIG. 3a or FIG. 3b. The first adhesive is preferably an optically clear adhesive or a gel that has a complementary index of refraction to the optical fibers 114.

The first ferrule 112 is held suspended above the top surface of the array of optoelectronic devices 106 in the first adhesive 116. The optical adhesive 116 may be cured with UV light, RF radiation, air, microwave radiation or thermal means, depending on the type of adhesive that is used. Once the optical adhesive 116 is cured, the space or gap between the second end of the first ferrule 320 and the top surface of the optoelectronic devices 118 is preserved or set; this space having been filled with the first adhesive 116. In other words, a thin layer of first adhesive 116 exists at the interface between the second end of the first ferrule 320 and the top surface of the optoelectronic devices 118.

The first adhesive 116 functions to stabilize and hold the first ferrule 112 to the array of optoelectronic devices 106. The first adhesive 116 maintains the precise alignment of the array of optical fibers 114 packaged in the first ferrule 112 to the array of optoelectronic devices 106. The first adhesive also functions to maintain the gap that exists between the first ferrule 112 and array of optoelectronic devices 106.

Advantageously, the first adhesive 116 produces a high coupling efficiency between the array of optical fibers 114 packaged in the first ferrule 112 and the array of optoelectronic devices 106. Specifically, the first adhesive 116 is an optically clear adhesive or gel and has almost the same refractive index as the optical fibers. Accordingly, by providing a refractive index match to the optical fibers, light passing from the array of optoelectronic devices 106 to the array of first fibers 114 (or vice versa) experiences minimal Fresnel reflection loss and optical divergence over the gap distance that exists between the array of optoelectronic devices 106 and the array of first fibers 114. This produces a high-coupling efficiency at the interface between the top surface of the optoelectronic devices 106 and the optical fibers 114. The first adhesive 116 also serves to prevent air from existing at the interface or space between the first ferrule 112 and the array of optoelectronic devices 106. The elimination of air at the interface or gap is desirable because air has a lower refractive index than the optoelectronic devices 106, the optical fibers 114 and the first adhesive 116. The refractive index difference introduces reflection losses, and the lower reflective index results in greater beam divergence per unit propagation length. If air were present, light passing from the optoelectronic devices 106 to the optical fibers 114 (or vice versa) may experience greater divergence, thereby reducing the efficiency of the coupling. Furthermore, the first adhesive prevents a second adhesive 122 from inadvertently seeping or wicking into the gap or space between the bottom surface of the ferrule and the top surface of the optoelectronic devices. Consequently, the first adhesive 116 advantageously produces a high-coupling efficiency between the optoelectronic devices 106 and the optical fibers 114 that are packaged in the first ferrule 112.

The first adhesive 116 not only enhances the coupling efficiency between the optical fibers 114 and optoelectronic devices 106 by providing a refractive index match to the optical radiation, but it also serves another important purpose. Specifically, the first adhesive 116 provides mechanical robustness by securing the first ferrule 112 to the array of optoelectronic devices 106. As previously stated, the gap or space between the bottom surface of the first ferrule 112 and the top surface of the optoelectronic devices 118 is filled with the first adhesive. The first adhesive functions to mechanically stabilize the first ferrule 112 to the head region 302 of the flexible printed circuit board 102. The first adhesive 116 provides support for any lateral, axial or rotational strain that may be created when a fiber optic cable is attached to the optical module. Furthermore, this allows proceeding to the dam and well-fill step, which is explained below, with minimal or no supporting structure to maintain the precision axial alignment of the array of optical fibers 114 packaged in the first ferrule 112 to the array of optoelectronic devices 106. Accordingly, the first adhesive 116 advantageously reduces manufacturing time and costs by providing mechanical robustness in addition to providing high coupling efficiency.

8. Second Adhesive and Dam

As previously stated, the first adhesive mechanically stabilizes the first ferrule 112 to the head region 302 of the flexible printed circuit board 102. In another embodiment, a second adhesive 122 may be adapted to the head region 302 to further mechanically stabilizes the first ferrule 112 to the head region 302 of the flexible printed circuit board 102, as shown in FIG. 3a or FIG. 3b. Similar to the first adhesive 116, the second adhesive 122 may provide support for any lateral, axial or rotational strain that may be created when a fiber optic cable is attached to the optical module. No dam is necessary to form the first adhesive 116.

To further mechanically stabilize the first ferrule 112 to the head region, a dam 120 may be formed on the head region 302 and filled with the second adhesive 122, as shown in FIG. 3a or FIG. 3b. The second adhesive, however, may be used without the dam. The dam may be constructed or dispensed, and the dam 120 may be dispensed and formed in a single or multi-layered path. The dam 120 may be in the shape of a square, diamond, oval or any other shape that effectively stabilizes and encloses the optoelectronic devices and possibly wire bonds and other die on the head region 302 of the flexible printed circuit board 102. The dam 120 may furthermore surround and enclose all of the components on the head region 302 for extra protection. The dam 120 may be constructed and formed on the first surface 310 of the head region 302 of the flexible printed circuit board 102.

The dam 120 may surround the first ferrule 112, driver or amplifier chip 108 or other electrical components, as shown in FIG. 3a or FIG. 3b. The dam 120 may be composed of adhesive or epoxy. The dam 120 may be formed or built by dispensing several layers of adhesive or epoxy on top of each other over time until the desired height and width of the dam 120 is achieved. The adhesive or epoxy may be any standard well-fill or potting epoxy. Alternatively, as previously stated, the dam may be dispensed and formed in a single path.

The area within the dam may be filled with the second adhesive 122. The second adhesive 122 preferably covers the driver or amplifier chip 108, array of optoelectronic devices 106, and any other electrical components that are adapted to the head region 302, as shown in FIG. 3a or FIG. 3b. A sufficient amount of second adhesive 122 is poured inside the dam area so that the height of the second adhesive 122 may span from the first surface 310 of the head region 302 of the flexible printed circuit board 102 to somewhere below the first end 318 of the first ferrule 112, as shown in FIG. 3a or FIG. 3b. After the second adhesive 122 has been cured, the dam 120 and second adhesive 122 function to mechanically stabilize the first ferrule 112 to the first surface 310 of the head region 302 of the flexible printed circuit board 102.

Advantageously, the dam 120 and second adhesive 122 may provide additional mechanical support to further stabilize the first ferrule 112 to the head region 302 of the flexible printed circuit board 102. The dam 120 and second adhesive 122 may function to absorb stress and provide rigidity and strength that may be needed when connecting the optical module to an external environment such as a fiber optic cable. Also, the dam 120 and second adhesive 122 may prevent movement that may occur over temperature variances. Moreover, the dam 120 and second adhesive 122 may function to provide moisture blocking and protection to the electrical components and circuitry adapted to the first surface 310 of the head region 302 of the flexible printed circuit board 102.

9. Third Layer

For airtight sealing of the optical module, the surface area of the second adhesive 122 may be covered with a third layer. The third layer may protect the optical module by blocking the permeation of moisture and providing electric shielding. The third layer may be a conductive and or moisture blocking adhesive such as gel silicon resin. It may also be a metallic, dielectric or other type of coating that provides necessary protection to the optical module.

10. Attenuator or Conditioner

In an embodiment of the invention, an attenuator may be used that functions to modify the performance of the array of optoelectronic devices. Specifically, superior performance of the array of optoelectronic devices typically is found if such devices are operated at the midpoint rather than low-point of their power range. However, operating the optoelectronic devices at the mid-point of their power range may not meet optical output requirements. One solution is to operate the optoelectronic devices at the mid-point of their power range but not transmit all of the power out of the end of the array of optical fibers. This may be accomplished through the use of the attenuator. The attenuator may function to reflect, absorb and or scatter the optical output of at least one optoelectronic device. Also, the attenuator advantageously may control optical cross-talk, reduce back-reflection and may eliminate feedback noise.

One embodiment of the attenuator may be a coating on the first or second end of the first ferrule or a coating on the first or second end of the array of optical elements that are packaged in the ferrule. It also may comprise a coating on the first end of the array of optoelectronic devices. The coating may be a metal, dialetric, organic or other material, and the coating may be patterned. Another embodiment of the attenuator may be a gel-like substance that is deposited in the gap that exists between the first end of the optoelectronic devices and the first end of the optical fibers. In this embodiment, the attenuator would function to absorb some of the light emitted by the optoelectronic devices. Other embodiments of the attenuator may be increasing the absorption of the first adhesive, introducing a controlled seeping or wicking of an absorbing second adhesive, changing the gap distance to reduce coupling, changing the refractive index to introduce Fresnel reflection and introduce divergence, changing the lateral alignment, or changing the surface finish of the optical fibers. Finally, other embodiments of the attenuator may include changing the optical transmission characteristics of the array of optical fibers so that they absorb, reflect and or scatter light. In this manner, the optical energy exiting the array of optical fibers will have its signal power reduced. This may be accomplished by changing the surface finish of the cores of the optical fibers (e.g., using frosted, wavy or rough surface glass) or by coating the inner surfaces of the fiber optic cores.

Finally, in another embodiment of the invention, a conditioner may be used to improve the performance of the array of optical fibers by changing the way the optical energy is launched into the optical fibers. For example, conditioning the launch of optical energy can improve the effective bandwidth of the optical fibers. The conditioner may function to change the phase distribution of the optical energy that is emitted by the optoelectronic devices.

Conditioning the launch of the optical energy flowing into the optical fibers from the optoelectronic devices may be accomplished as follows: (1) patterning a coating on the first end of the array of optoelectronic devices; (2) patterning a coating on the first or second end of the array of optical fibers; (3) depositing a gel-like substance between the first end of the optoelectronic devices and the first end of the optical fibers; (4) adapting a diffractive object on the input or output of the array of optical fibers so as to change the structure of the optical energy; (5) changing the lateral position of the array of optoelectronic devices relative to the array of optical fibers; (6) changing the optical transmission characteristics of the array of optical fibers; (7) tilting the array of optoelectronic devices relative to an optical path; and (8) changing the optical transmission characteristics of the array of optical fibers so that they absorb, reflect and or scatter light. These and other methods that are known in the art may be used to improve the performance of the array of optical fibers by changing the way the optical energy is launched into the optical fibers.

B. Buckle Region

In addition to the head region 302, the flexible printed circuit board 102 also comprises a buckle region 304, which will now be described with reference to FIG. 3a or FIG. 3b. The buckle region 304 is that area of the flexible printed circuit board 102 connecting the head region 302 to the main body region 306 of the flexible printed circuit board 102. The buckle region 304 is thin and composed of the same multi-layered structure as the other regions of the flexible printed circuit board 102. A plurality of electrical circuitry may be adapted both to a first surface and a second surface of the buckle region 304. The electrical circuitry functions to electrically connect the head region 302 to the main body region 306 of the flexible printed circuit board 102.

The buckle region functions to absorb any stress and misalignment that may occur when the head region 302 and main body region 306 are connected to the circuit board mounting structure 104 during the assembly process. Specifically, after the head region 302 is attached to the circuit board mounting structure 104, the flexible printed circuit board 102 is wrapped or folded around and attached to the circuit board mounting structure 104, as explained in detail below. Alternatively, the main body region 306 may be first connected to the circuit board mounting structure 104 followed by folding the flexible printed circuit board and connecting its head region 302 to the circuit board mounting structure 104. The housing 124 is then connected to the circuit board mounting structure 102. The first ferrule 112, which is adapted to and protrudes from the head region, is then aligned and housed in a longitudinal cavity 1006 of the housing 124. However, stress or misalignment may occur when connecting the housing 124 to the circuit board mounting structure 104.

The buckle region 304 functions to absorb any misalignment or stress that may occur during this assembly process. As shown in FIG. 3a or FIG. 3b, the buckle region 304 bends in the "Y" direction. Bending the buckle region 304 provides the buckle region 304 with bending freedom in the x, y and z direction, as well as rotational freedom. This bending freedom allows the buckle region 304 to absorb any stress that may occur during the assembly process when aligning and attaching the housing 124 to the circuit board mounting structure 104.

C. Main Body Region

In addition to a buckle region 304 and a head region 302, the flexible printed circuit board 102 also comprises a main body region 306. The main body region 306 will now be described with reference to FIG. 3a or FIG. 3b. The main body region 306 is thin, rectangular shaped and flexible. The main body region 306 is composed of the same multi-layered structure as the other regions of the flexible printed circuit board. The main body region 306 functions to house the other electrical components and circuitry of the optical module 100. The electrical components may serve a variety of functions, including connection of the optical module to the system to which it is located. Accordingly, a plurality of electrical components 308 and a plurality of electrical circuitry may be adapted to a first surface 324 and/or a second surface 326 of the main body region 306 of the flexible printed circuit board 102, as shown in FIG. 3a or FIG. 3b.

1. Electrical Connections

A series of electrical connections may be adapted to the first or second surface 324 of the main body region 324 of the flexible printed circuit board 102. The electrical connections function to electrically connect the flexible printed circuit board to an external environment such as another circuit board. The electrical connections may comprise ball grid arrays, solder balls, wire leads, land-grid arrays with conductive interposers, or any other means to electrically connect the flexible printed circuit board to an external environment.

D. Summary

In summary, the flexible printed circuit board 102 supports the main electrical components and elements of the optical module, such as the optoelectronic devices 106, driver or amplifier chip 108 and first ferrule 112, as well as providing bending freedom and stress relief to the optical module 100. The flexible printed circuit board 102 is attached to, and partially enclosed by, a housing 902, which is described below.

II. Circuit Board Mounting Structure and Housing

Figure 9:
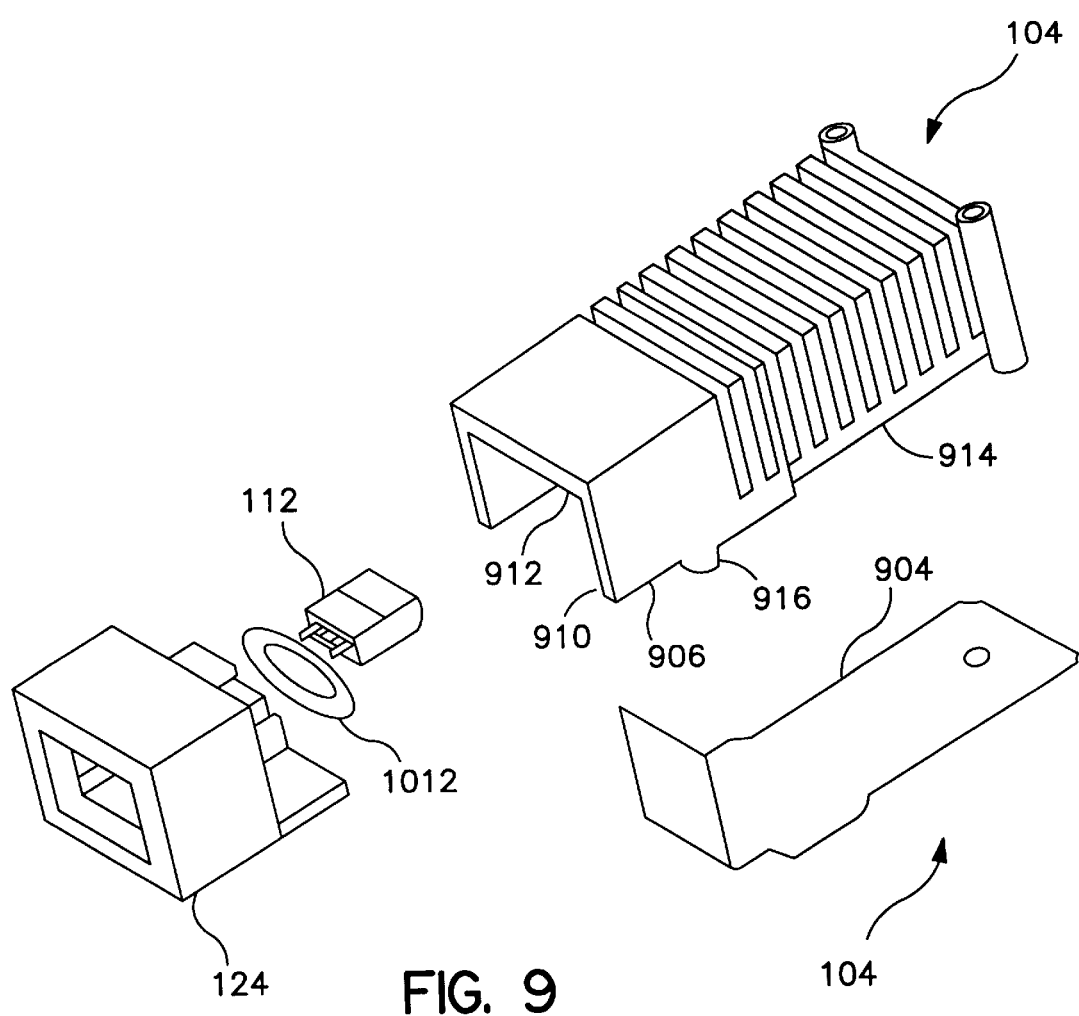
FIG. 9 is an exploded view of an embodiment of the housing, an embodiment of the first ferrule, an embodiment of a circuit board mounting structure and an embodiment of the flexible printed circuit board, according to an embodiment of the invention.

FIG. 9 is an exploded view of the flexible printed circuit board 102, first ferrule 112, a circuit board mounting structure 104 and an housing 124.

A. Circuit Board Mounting Structure

The circuit board mounting structure 104 functions in part as a mounting structure for the flexible printed circuit board and as a heat sink to dissipate heat generated by the circuit board 102. Specifically, the flexible printed circuit board 102 is bent and wrapped around the circuit board mounting structure 104. A second surface 904 of the flexible printed circuit board 102 is attached to a bottom surface 914 and a first end 910 of the circuit board mounting structure 104, as shown in FIG. 9. Alignment ridges, guide pins or guide pin holes may exist along the bottom surface 914 and first end 910 of the circuit board mounting structure, although they are not necessary. The alignment features assist in aligning and holding the flexible printed circuit 102 board to the circuit board mounting structure. A fourth adhesive is used to firmly attach the flexible printed circuit board 102 to the circuit board mounting structure 104. The thermal expansion coefficient and compliance of the fourth adhesive advantageously assists in preventing expansion or contraction of the circuit board mounting structure from damaging the flexible printed circuit board 102. The flexible printed circuit board 102 bends around the circuit board mounting structure 104 in such a manner that the head region 302 of the flexible printed circuit board 102 is housed inside the first end 910 of the circuit board mounting structure 104, as shown in FIG. 9. A cavity 912 on the first end 910 of the circuit board mounting structure 104 functions to house the head region 302 of the flexible printed circuit board 102. In another embodiment, there is no cavity 912, as explained below. A series of heat sink ridges adapted to the circuit board mounting structure function to dissipate heat generated by the flexible printed circuit board.

In an embodiment as shown in FIG. 7, the second surface 704 of the head region 302 of the flexible printed circuit board 102 is attached to the first surface 710 of the optoelectronic mounting structure 702. The second surface 712 of the optoelectronic mounting structure 702 is attached to the upper surface 708 of the circuit board mounting structure 104 with a compliant adhesive. The flexible printed circuit board 102 then wraps around the circuit board mounting structure 104 so that the remaining portion of the second surface 904 of the flexible printed circuit board is attached to the bottom surface 914 of the circuit board mounting structure 104, as shown in FIG. 9.

As shown in FIG. 9, the circuit board mounting structure has feet 916 for connecting the optical module 100 to an external environment such as a second circuit board 202. The feet 916 have ridges that allow a portion of each foot 916 to drop into a hole on the second circuit board 202 and therefore attach and align the optical module 100 to the second circuit board 202. The ridges on the feet also maintain the optical module 100 at a specified distance above the second circuit board 202.

The circuit board mounting structure 104 has snap slots 906, set screw holes and or alignment pin holes on the first end 910 for connecting the first end of the circuit board mounting structure to housing 124, as discussed in detail below.

B. Housing

The housing 124 is connected to the circuit board mounting structure 104, and the housing 124 will now be described in detail with reference to FIG. 10. The housing 124 may be made of a non-conductive material. The housing 124 comprises a mating end 1002, as shown in FIG. 10a, and a receiving end 1004, as shown in FIG. 10b. A longitudinal cavity 1006 extends through the housing 124 from the mating end 1002 to the receiving end 1004, as shown in FIGS. 10a–10b.

The mating end 1002 of the housing 124 has tabs 1008 and alignment pins 1010 for connecting the mating end 1002 to the first end 910 of the circuit board mounting structure 104, as shown in FIG. 10a. The position of the tabs 1008 correspond to the position of the snap slots 906 located on the first end 910 of the circuit board mounting structure 104. Similarly, the position of the alignment pins 1010 correspond to the position of the alignment pin holes on the first end 910 of the circuit board mounting structure 104. (See FIG. 9.) Thus, by simply engaging the tabs 1008 and alignment pins 1010 on the housing 124 into the snap slots 906 and alignment pin holes on the circuit board mounting structure 104, the housing 124 snaps on to the circuit board mounting structure 104 and is firmly attached. In the above-stated embodiment, the housing is snapped onto the circuit board mounting structure. In other embodiments, the housing may be connected by using other attachment methods such as glue, screws or through the use of other mechanical fixtures. Furthermore, inserts may be adapted to the mating end of the housing that function to hold the circuit board mounting structure to the housing. The inserts aid in applying a force to the tabs that maintain the tabs firmly in place. These inserts may be in the form of wedges, spring-clips, stakes or shims.

Additionally, alignment members on the mating and receiving ends of the housing function to hold and align the position of the first and second ferrules relative to the position of the housing. These alignment members may be inwardly sloping walls at an opening of the longitudinal cavity. The alignment members act independently or in concert with the alignment pins and tabs to align and connect the first ferrule and the circuit board mounting structure.

Once the housing 124 is snapped onto the circuit board mounting structure 104, at least one elastomeric pressure ring 1012 that is in proximity to the housing 124 functions to secure the housing 124 and the head region 302 of the flexible printed circuit board 102 to the circuit board mounting structure 104. Specifically, the elastomeric pressure ring 1012 may be in a variety of shapes and forms such as a circular, oval spaces or donuts, as shown in FIG. 9. The elastomeric pressure ring 1012 has multiple purposes. First, upon connecting the housing 124 to the circuit board mounting structure 104, the elastomeric pressure ring 1012 is compressed, and this compression creates an outward elastomeric force in the direction of the receiving end 1004 of the housing 124 that maintains the tabs 1008 and the snap slots 906 in a firmly locked position. With the compression force on the tabs 1008 and snap slots 906, a high degree of manufacturing tolerances is achieved. Second, the pressure or force created by the compressed ring 1012 aids in bonding the optoelectronic mounting structure 702 to the circuit board mounting structure 104. The optoelectronic mounting structure 702 is bonded to the circuit board mounting structure 104 with adhesive, and the pressure produced by the compressed ring 1012 holds the optoelectronic mounting structure 702 firmly against the circuit board mounting structure 104 while the adhesive is cured. Accordingly, the elastomeric pressure ring 1012 produces tighter bonding between the circuit board mounting structure 104 and the optoelectronic mounting structure 702. Third, once the housing 124 is snapped onto the circuit board mounting structure 104, the pressure or force created by the elastomeric pressure ring 1012 provides a more robust moisture seal between the housing 124 and the circuit board mounting structure 104.

Upon attachment of the housing 124 to the circuit board mounting structure 104, the first ferrule 112 is housed in the longitudinal cavity 1006 of the housing 124, and alignment ridges inside the longitudinal cavity 1006 engage and hold the first ferrule 112 in place.

In the above-described embodiment as shown in FIGS. 9–10, the housing 124 slides into the circuit board mounting structure 104, and the head region 302 of the flexible printed circuit board 102 is buried in the cavity 912 of the first end 910 of the circuit board mounting structure 104. However, in another embodiment, the first end 910 of the circuit board mounting structure 104 may not have a cavity, and the head region 302 may exist on the outside of the first end 910 of the circuit board mounting structure 104. In this embodiment, instead of having the housing 124 slide into the circuit board mounting structure 104, the housing 124 may slide over the circuit board mounting structure 104, and the head region 302 may be housed in a cavity inside the housing 124. In still another embodiment, neither the housing 124 nor the circuit board mounting structure 104 may have a cavity, and the two parts simply may mate with each other.

Finally, in another embodiment of the housing, a metallic coating may be applied to at least a portion of the mating end 1002 of the housing 124. The metallic coating functions to provide electromagnetic shielding. In yet another embodiment, the housing may be made out of multiple materials and at least one of those materials would function to provide electromagnetic shielding.

C. Attachment of Fiber Optic Cable

Finally, as shown in FIG. 10b, the receiving end 1004 of the housing 124 functions to connect the optical module 100 to an external system. The receiving end 1004 receives a second ferrule 206, which is typically attached to one end of a fiber optic cable 204. The second ferrule mates with the first ferrule, as described below. The second ferrule 206 may be a MT type connector, MU type connector, MPO type connector or other type connectors.

In operation, the second ferrule 206 is inserted into the receiving end 1004 of the housing 124. Wings 1014, snaps or beams on the receiving end 1004 align, grab and hold the second ferrule 206, and the wings 1014 snap onto the second ferrule 206. The wings 1014 function to provide alignment compliance when connecting the second ferrule 206 to the housing 124. Moreover, the wings 1014 are flexible and may absorb any stress that may arise due to movement of the cable 204 that is attached to the second ferrule 206. The wings 1014 further provide a holding force that aids in holding the second ferrule 206 to the first ferrule 112. Alignment ridges inside the longitudinal cavity 1006 of the housing 124 further engage and hold the second ferrule 206 in place.

Once inside the longitudinal cavity 1006, the second ferrule 206 mates with the first ferrule 112 that is also housed in the longitudinal cavity 1006 of the housing 124. The second ferrule 206 mates with the first ferrule 112 by engaging the alignment pins 316 located on the first end 318 of the first ferrule 112 with alignment pin holes located on a mating end of the second ferrule 206. The alignment pins 316 and alignment pin holes function to provide fine alignment between the mating arrays of optical fibers that are packaged within the mating ferrules. Alternatively, the first ferrule may have alignment holes and the second ferrule may have alignment pins, and the ferrules would accordingly mate in a similar fashion.

Once the ferrules are mated, the array of optical fibers that are packaged in the ferrules are axially aligned, and the ferrules are optically connected. For example, if the optical module 100 functions as a receiver, optical signals pass from the fiber optic cable 204, through the optical fibers packaged in the ferrules 206 and 112 and to the optoelectronic devices 106, which are mounted on the flexible printed circuit board 102. The optical module 100 converts the optical signals into electrical signals and transmits these signals to an external environment, such as a printed circuit board, for processing.

III. Alignment and Attachment Process

A. Overview

An important aspect of an embodiment of the invention is the precise alignment and attachment of the first ferrule 112 to the array of optoelectronic devices 106 that are mounted on the flexible printed circuit board 102. A process, according to an embodiment of the invention, for aligning and connecting the first ferrule 112 to the array of optoelectronic devices 106 comprises the following steps:

1. Holding the first ferrule 112 directly above the optoelectronic devices 106;
2. Aligning the array of optical fibers 114 packaged in the first ferrule 112 with the array of optoelectronic devices 106 so that each optical fiber is optically aligned to a corresponding individual optoelectronic device;
3. Depositing the first adhesive 116 on a top surface of the array of optoelectronic devices 106;
4. Placing the first ferrule 112 on top of the first adhesive 116;
5. Tacking and curing the first adhesive 116 as to mechanically stabilize the first ferrule 112; and
6. Forming a dam 120 around the first ferrule 112 on the flexible printed circuit board 102, dispensing the second adhesive 122 inside the dam area, and curing the first adhesive 122.

These precision alignment and attachment steps are discussed below.

A high-precision alignment machine may be used in combination with a series of other apparatuses to produce precise alignment and attachment of optical fibers to optoelectronic devices. These machines combine many critical technologies to perform alignment with a low-cost manufacturing environment. These technologies include: (1) a high-precision stage that is used to hold the flexible printed circuit board 102; (2) a high-precision alignment arm for accurately placing the first ferrule 112 on the optoelectronic devices 106 that are adapted to the flexible printed circuit board 102; (3) a top-down view camera; (4) side-view camera; (5) video monitors; (6) split-field microscope; and (7) optical video system function together to replace the labor-intensive active-alignment process. Alternatively, computers and software may perform many of above-stated technologies. An example of one of the many process that may be used with this equipment is explained in the following paragraphs.

B. An Apparatus for Holding an Optical Element

The first step in the precise alignment and attachment of the first ferrule 112 to the array of optoelectronic devices 106 is to hold the first ferrule 112 at the end of a high-precision stage. This is accomplished through the use of an apparatus for holding an optical element, as explained in this section.

FIGS. 11a–11b show views of an embodiment of the apparatus for holding an optical element. The apparatus for holding an optical element 1100 holds the first ferrule 112 through the use of pin-positioning holes 1102 and vacuum pressure. The apparatus for holding an optical element has a first end 1112 and a second end 1114. The apparatus for holding an optical element 1100 may have two pin-positioning holes 1102 on a bottom surface 1104 of the second end 1114 for receiving the alignment pins 316 of the first ferrule 112, as shown in FIGS. 11a–11b. As shown in FIG. 11b, an array of optical fibers 1106 may be packaged between the pin-positioning holes 1102, and it is optically aligned with the array of optical fibers 114 that are packaged in the first ferrule 112. The innermost optical fibers in the apparatus for holding an optical element 1100 are milled out, forming a longitudinal cavity 1108 running through the apparatus for holding an optical element 1100 from the first end 1112 to the second end 1114, as shown FIG. 11b. A vacuum is placed at a top surface of the first end 1112 of the longitudinal cavity 1108, and the longitudinal cavity 1108 functions as a vacuum slot. Accordingly, once the alignment pins 316 from the first ferrule 112 are mated with the pin-positioning holes 1102 on the apparatus for holding an optical element 1100, the vacuum slot functions as a vacuum clamp, holding the first ferrule 112 in place. Alternatively, an electrostatic clamp may be used in place of the vacuum clamp. Also, another embodiment may comprise alignment pins in place of the pin-positioning holes 1102, and the alignment pins would function to connect to pin-positioning holes in a ferrule.

The apparatus for holding an optical element 1100 has multiple advantages and uses. First, it permits holding and manipulating the first ferrule 112 in both the x, y, and z direction as well as rotational directions. This aids in achieving precise alignment and attachment of the first ferrule 112 to the optoelectronic devices 106. Also, the apparatus for holding an optical element 1100 grasps the first ferrule 112 without interfering, obscuring or damaging the optical fibers 114 in the first ferrule 112. Additionally, the apparatus for holding an optical element 1100 allows access to the optical fibers 114 in the first ferrule 112 so that optical coupling may be achieved. For example, a light may be mounted on top of the apparatus for holding an optical element 1100 so that the optical fibers 114 emit light while being held by the apparatus for holding an optical element 1100. The light emitted from the fibers 114 may then be used to aid in optically coupling the first ferrule 112 to the optoelectronic devices 106. Conversely, light from the optoelectronic devices may be used to aid in optically coupling the first ferrule 112 to the optoelectronic devices 106. Additionally, the apparatus for holding an optical element 1100 provides a strain-less release mechanism through the use of the vacuum clamp. By simply turning off the vacuum pressure, the apparatus for holding an optical element 1100 gently releases the first ferrule 112.

The apparatus for holding an optical element 1100 also may be used for a variety of different purposes other than holding a ferrule. For example, it may be used to align and attach a micro-pipette array to a biological sensor array or a lens array to a MEMS modulator array. It also may be used to attach a single or array of optical fibers to a variety of different objects or devices. Moreover, the optical element may be a MT type connector, ferrule, MT-like ferrule, lenslet array, a diffractive optical element or any other type of device that may be aligned with the device. Accordingly, the apparatus for holding an optical element 1100 has multiple advantages and uses.

C. Alignment Process—X, Y and Rotational Directions

Once the first ferrule 112 is held at the end of the high precision arm by the apparatus for holding an optical element 1100, the next step is to align the optical fibers with the optoelectronic devices in the x, y and rotational directions. In this section, three different alignment process are described.

1. Image Alignment Process

The first process for aligning the optical fibers with the optoelectronic devices in the x, y and rotational directions is an image alignment process. In this embodiment of the invention, a split-field microscope is used to align the optical fibers with the optoelectronic devices by super-imposing an image of at least one optical fiber with an image of at least one optoelectronic devices. Specifically, once the first ferrule 112 is held at the end of the high precision arm by the apparatus for holding an optical element 1100, the array of optoelectronic devices, which are mounted on a flexible printed circuit board, are held on a high-precision stage. A top-down view camera may be mounted above the high-precision stage holding the optoelectronic devices. With the aid of a split-view microscope and a split-field optic video system, a top-down image of the flexible printed circuit board 102, situated on the high precision stage, is displayed on a monitor.

The focus and zoom on the split-field microscope and or the stage holding the flexible printed circuit board are adjusted until the optoelectronic devices 106 that are adapted to the flexible printed circuit board 102 are in view on the video monitor. The top surface of the array of optoelectronic devices 106 appears as rings 1202 on the video monitor under the high magnification of the microscope, as shown in FIG. 12a. A split-field video system permits simultaneous viewing of two opposite corners 1204 or ends of the array of optoelectronic devices 106 with high magnification on the video monitor. The precision stage holding the flexible printed circuit board is adjusted until the first optoelectronic device 1206 and the twelfth optoelectronic device 1208 are displayed simultaneously on the video monitor, as shown in FIG. 12b.

A light is mounted above the high-precision arm, emitting optical radiation down into the optical fibers 114 that are packaged in the first ferrule 112. The light flowing down the optical fibers back-lights the fiber cores, and this provides a well-resolved image of the fiber cores under the split-field microscope. The image of the cores then appear as an array of well-resolved spots under the split field microscope, as shown in FIG. 12c.

Once the split-field microscope has formed an image of the fiber cores and an image of the optoelectronic devices, these two images are then superimposed by the split-field microscope to perform the alignment process. Specifically, by adjusting the x and y position of the high-precision stage, the image of the illuminated fiber cores of the first optical fiber 1212 and twelfth optical fiber 1214 are aligned within the image of the rings of the first optoelectronic device 1206 and twelfth optoelectronic device 1208 via the split-field microscope so that the spots and rings form a bull's eye pattern, as shown in FIG. 12d. This process precisely aligns in the x, y and rotational direction the array of optical fibers 114 that are packaged in the first ferrule 112 with the array of optoelectronic devices 106 that are adapted to the flexible printed circuit board 102. In another embodiment, images of the optical fibers and optoelectronic devices other than the images of the first and twelfth optical fibers and optoelectronic devices may be used to achieve the same result.

2. Optical Energy Alignment Process

A second process to align the optical fibers with the optoelectronic devices in the x, y and rotational directions is an optical energy alignment process. In this embodiment of the invention, the flexible printed circuit board is again held by a high-precision stage. A light is mounted above the high-precision arm that holds the first ferrule, and the light emits optical radiation down into the optical fibers 114 that are packaged in the first ferrule 112. The light flowing out of the optical fibers 114 radiates down onto the flexible printed circuit board 102, which is positioned on the high-precision alignment stage. Under the high magnification of a microscope, this light appears as a series of illuminating spots on the optoelectronic devices 106. Each illuminating spot corresponds to an optical fiber in the array of optical fibers 114 that are packaged in the first ferrule 112. By adjusting the x and y position of the high-precision stage, the spots may be visually aligned with the rings to form a bull's eye pattern under the high magnification of a microscope. (This alignment process may be performed by machine vision rather than by human vision.) The alignment process precisely aligns in the x, y and rotational direction the array of optical fibers 114 that are packaged in the first ferrule 112 with the array of optoelectronic devices 106 that are adapted to the flexible printed circuit board 102.

3. Precision Placement Alignment System

A third process to align the optical fibers with the optoelectronic devices in the X, Y and rotational directions is a precision placement system. In this embodiment of the invention, a precision placement system is connected to a high-precision arm that holds the first ferrule, and the system also is connected to a high-precision stage that holds the optoelectronic devices. The precision placement system aligns the objects by first calculating their initial position in space by comparing their position to a known position in space. Based upon this information, the system calculates the relative distances that the objects are apart. Once the relative distances are determined, the precision placement system aligns the objects by sequentially moving the objects and re-calculating their relative distances until they are precisely aligned.

In one embodiment of the invention, the precision placement system may determine the initial position in space of the array of optical fibers and the optoelectronic devices by holding the objects within a field of view of a microscope. Since the position of the cross-hairs on the microscope is known, the precision placement system knows the position of the optical fibers and optoelectronic devices relative to the position of the cross-hairs. Based upon this information, the precision placement system then calculates the relative positions of the objects to each other. Knowing the relative distances, the precision placement sequentially and continually moves the position of the objects and re-calculates their relative positions to each other until the optical fibers and optoelectronic devices are precisely aligned.

In another embodiment of the invention, the precision placement system may determine the initial position in space of the array of optical fibers and the optoelectronic devices by moving the objects to a point in space whose position is already known by the system. For example, the system may move the objects to corner mark on a jig or a precision touch sensor. Once the objects are referenced to that point in space, the precision placement system can calculate their relative positions to each other. The precision placement system then sequentially moves the position of the objects while continually re-calculating their relative positions to each other until they are precisely aligned.

D. Alignment Process—Z Axis Direction

Once the optical fibers 114 and optoelectronic devices 106 are aligned the X, Y and rotational directions, the high-precision alignment arm is lowered until the first ferrule 112 is within a few microns from the optoelectronic devices 106. This vertical or Z-axis alignment process is accomplished through the use of a video-image measuring system that functions in concert with the previously-described precision equipment. This z-axis alignment process is described below.

A video-image measuring system is connected between a monitor and a side-view camera that is mounted near the side of the high-precision stage. With the aid of the microscope, the side-view camera views the side of the optoelectronic devices 106 and first ferrule 112, and this image is displayed on the monitor.

Figure 13:
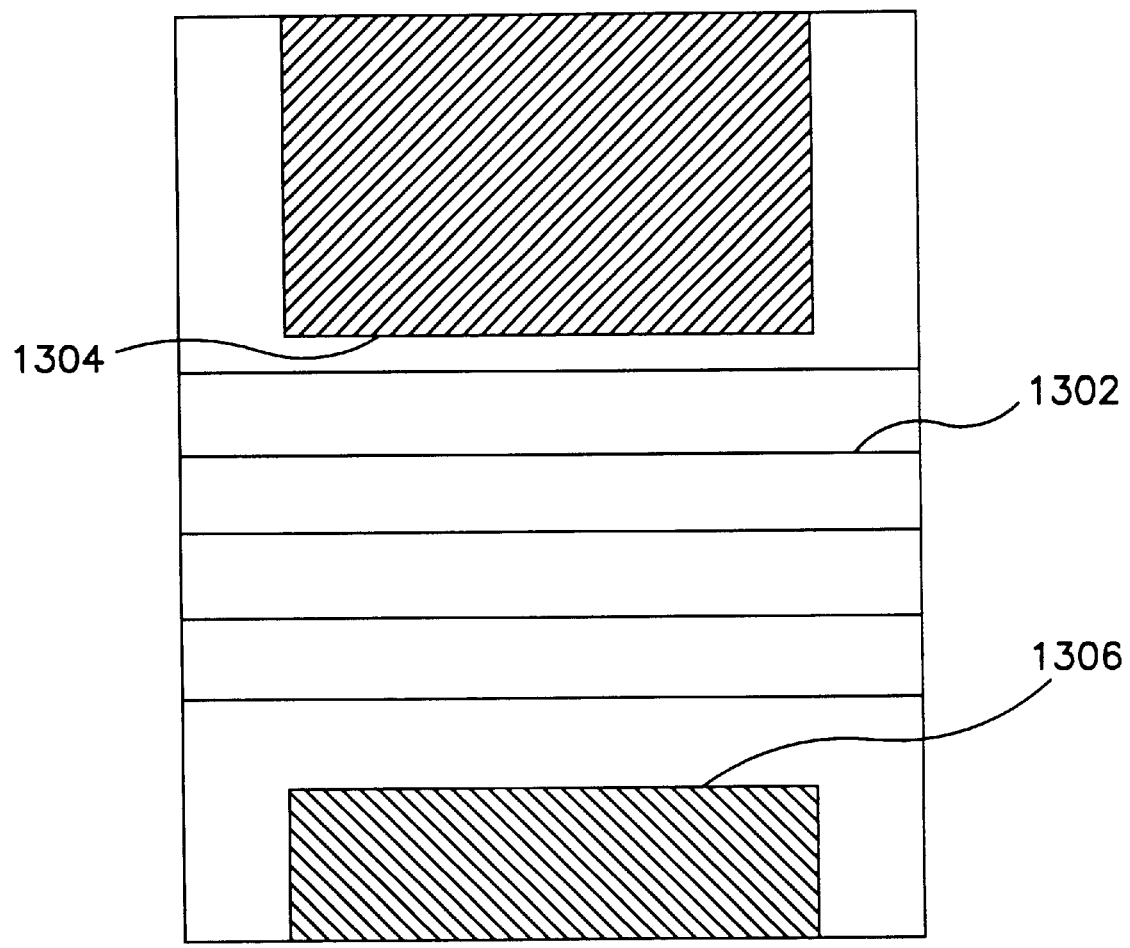
FIG. 13 shows the display on a monitor of a video image measuring system.

FIG. 13 is a view of the monitor when using the video-image measuring system. The video image measurement system generates positional measuring lines 1302 over the images on the monitor, and the lines 1302 allow a user to measure the vertical distance or Z-axis height between a bottom edge 1304 of the first ferrule 112 and a top edge 1306 of the optoelectronic devices 106, as shown in FIG. 13. By adjusting the z position of the high-precision arm and the high-precision stage, the distance between the bottom edge 1304 of the first ferrule 112 to the top edge 1306 of the optoelectronic devices 106 is adjusted until the objects are within a few microns (e.g., approximately 35 microns apart). Accordingly, a gap exists between the first ferrule 112 and the optoelectronic devices 106.

In another embodiment of the process, the z-axis alignment process may be accomplished by using laser-triangulation, interference microscopy or a touch sensor.

E. Mechanical Stabilization Process

After the first ferrule 112 and optoelectronic devices 106 are precisely positioned in space, the high-precision placement arm is raised, moving the first ferrule 112 away from the optoelectronic devices 106 in the vertical or Z-axis direction. A small volume of first adhesive 116 is then dispensed on the top surface of the optoelectronic devices 106 by a high precision, motor-driven syringe.

The high-precision placement arm is again lowered in the vertical or Z-axis direction until the first ferrule 112 contacts the optical adhesive 116, which has been dispensed on the top surface of the optoelectronic devices 106. The first ferrule 112 is suspended above the top surface of the optoelectronic devices in the liquid optical adhesive 116. The first adhesive 116 may be cured using a UV light curing system.

At this point, the first ferrule 112 is attached to the optoelectronic devices 106 with the first adhesive 116 and is held from above by the apparatus for holding an optical element 1100. As previously stated, the first adhesive mechanically stabilizes the first ferrule 112 to the optoelectronic devices 106. The first ferrule 112 is separated from the apparatus for holding an optical element 1100 releasing the vacuum clamp on the apparatus for holding an optical element 1100 and raising the high precision alignment arm.

To further mechanically stabilize the first ferrule 112 to the head region 302 of the flexible printed circuit board 102, a dam 120 may be formed on the flexible printed circuit board 102 and filled with the second adhesive 122. A software-controlled dam and dam fill dispensing machine may be used to apply the dam 120 on the first surface 310 of the head region 302 of the flexible printed circuit board 102. Alternatively, the dam and filling process may be done manually. The dam 120 is formed on the first surface 310 of the head region 302 of the flexible printed circuit board 102 surrounding the first ferrule 112, driver or amplifier chip 108 and any other electrical components. The dam 120 is composed of an adhesive .

Once the dam 120 is formed on the flexible printed circuit board 102, the automated fluid dispensing machine may be used to fill the area within the dam 120 with the second adhesive 122, as shown in FIG. 3*a*. The second adhesive 122 may be cured by placing the flexible printed circuit board 102 in an oven. After curing, the first ferrule 112 becomes further mechanically stabilized to the first surface of the head region 302 of the flexible printed circuit board 102.

F. Automating the Alignment Process

The entire process of precisely aligning and attaching the first ferrule 112 to the optoelectronic devices 106 and mechanically stabilizing it to the flexible printed circuit board 102 may be done manually. Alternatively, this process may be done automatically through the use of a computer generated system that functions in concert with the above-described precision equipment. Accordingly, this process is compatible with a mass-production manufacturing process that is the type of technology that is necessary to lower the cost of any commercially-available high-volume product.

G. Other Applications

Although an embodiment of the invention has been discussed in terms of accurately aligning and attaching an array of optical fibers to an array of optoelectronic devices, the same methodology may be employed to accurately align and connect an array of optical fibers to a wide variety of devices or objects other than optoelectronic devices. This is because there is a trend to miniaturization in many fields of science and technology that require work pieces to be positioned to a few microns and many times to sub-microns. Such fields include optics, microscopy, semiconductor technology, micro-machining, the life sciences and others. Accordingly, an embodiment of the invention may be used, for example, to accurately align and connect optical fibers to a microscope slide so as to study fluorescence light emitted from a biological sample such as a gene or insect. The light may be collected by the optical fibers and transmitted to a spectrometer for study. In another example, an embodiment of the invention may be used to accurately align and connect an array of optical fibers to micro-electromechanical systems ("MEMS"). MEMS technology involves combining semiconductor and micro-machining processes to produce tiny devices that are capable of motion on a microscopic scale on a silicon substrate. These systems may utilize the technology contained in an embodiment of the invention to accurately align and connect an array of optical fibers to the tiny devices in the micro-electromechanical system for a wide variety of applications. Consequently, an embodiment of the invention may be used to couple an array of optical fibers to a wide variety of devices or objects.

Finally, although an embodiment of the invention has been discussed in terms of passive alignment, an embodiment of the invention allows for active alignment and attachment of the array of optical fibers to an array of optoelectronic devices. As explained earlier, this process involves manually manipulating and connecting the optical fibers to the optoelectronic devices.

While we have described our preferred embodiments of the present invention, it is understood that those skilled in the art, both now and in the future, may make various improvements and enhancements that fall within the scope of the claims that follow. These claims should be construed to maintain the proper protection for the invention first disclosed.

What is claimed:

1. An apparatus comprising:
a) a mounting structure;
b) an array of optoelectronic devices adapted to the mounting structure, the optoelectronic devices having at least a first end;
c) an array of optical elements, the array of optical elements having at least a first end;
d) the first end of the array of optical elements positioned relative to the first end of the array of optoelectronic devices in such a manner that one or more optical elements is optically aligned to one or more optoelectronic devices; and
e) a heat spreader positioned along at least a portion of a surface of the mounting structure.

2. An apparatus as in claim 1, further comprising at least one opening in the mounting structure, the opening functioning to provide thermal access to the heat spreader.

3. An apparatus as in claim 1, further comprising at least one thermal via in the mounting structure, the thermal via functioning to transmit heat from the mounting structure to the heat spreader.

4. An apparatus as in claim 1, further comprising at least one heat pipe in the mounting structure, the heat pipe functioning to transmit heat from the mounting structure to the heat spreader.

5. An apparatus as in claim 1, wherein the heat spreader provides mechanical rigidity or stiffness to the mounting structure.

6. An apparatus as in claim 1, wherein the array of optoelectronic devices comprises vertical cavity surface emitting lasers.

7. An apparatus as in claim 6, wherein the vertical cavity surface emitting lasers comprise oxide vertical cavity surface emitting lasers.

8. An apparatus as in claim 1, wherein the array of optoelectronic devices comprises photodetectors.

9. An apparatus as in claim 1, wherein the optical elements are optical fibers.

10. An apparatus as in claim 1, wherein the optical elements are lenses.

11. An apparatus as in claim 1, wherein the array of optical elements is a lenslet array.

12. An apparatus as in claim 1, wherein the optical elements are diffractive optical elements.

13. An apparatus as in claim 1, wherein the optical elements are filters.

14. An apparatus as in claim 1, wherein the optical elements are packaged in a ferrule.

15. An apparatus as in claim 1, wherein the mounting structure is a flexible printed circuit board.

16. An apparatus comprising:
a) a mounting structure;
b) an array of optoelectronic devices adapted to the mounting structure, the optoelectronic devices having at least a first end;
c) an array of optical elements, the array of optical elements having at least a first end;
d) the first end of the array of optical elements positioned relative to the first end of the array of optoelectronic devices in such a manner that one or more optical elements is optically aligned to one or more optoelectronic devices; and
e) an electrical plane positioned along at least a portion of a surface of the mounting structure.

17. An apparatus as in claim 16, wherein the electrical plane further comprises an electrical contact and ground plane.

18. An apparatus as in claim 16, wherein the electrical plane functions as an electrical contact path to at least one electrical or optoelectronic component on the mounting structure.

19. An apparatus as in claim 16, wherein the electrical plane functions to limit electromagnetic interference to at least one electrical or optoelectronic component on the mounting structure.

20. An apparatus as in claim 16, wherein the electrical plane provides mechanical rigidity or stiffness to the mounting structure.

21. An apparatus as in claim 16, wherein the array of optoelectronic devices comprises vertical cavity surface emitting lasers.

22. An apparatus as in claim 21, wherein the vertical cavity surface emitting lasers comprise oxide vertical cavity surface emitting lasers.

23. An apparatus as in claim 16, wherein the array of optoelectronic devices comprises photodetectors.

24. An apparatus as in claim 16, wherein the optical elements are optical fibers.

25. An apparatus as in claim 16, wherein the optical elements are lenses.

26. An apparatus as in claim 16, wherein the array of optical elements is a lenslet array.

27. An apparatus as in claim 16, wherein the optical elements are diffractive optical elements.

28. An apparatus as in claim 16, wherein the optical elements are filters.

29. An apparatus as in claim 16, wherein the optical elements are packaged in a ferrule.

30. An apparatus as in claim 16, wherein the mounting structure is a flexible printed circuit board.

31. An apparatus comprising:
   a) a mounting structure,
   b) an array of optoelectronic devices adapted to the mounting structure, the optoelectronic devices having at least a first end;
   c) an array of optical elements, the array of optical elements having at least a first end;
   d) the first end of the array of optical elements positioned relative to the first end of the array of optoelectronic devices in such a manner that one or more optical elements is optically aligned to one or more optoelectronic devices; and
   e) a height adjuster positioned along at least a portion of a surface of the mounting structure.

32. An apparatus as in claim 31, wherein the height adjuster functions to change or control the height of at least one optical, electrical or optoelectronic component on the mounting structure.

33. An apparatus as in claim 31, wherein the height adjuster provides mechanical rigidity or stiffness to the mounting structure.

34. An apparatus as in claim 31, wherein the array of optoelectronic devices comprises vertical cavity surface emitting lasers.

35. An apparatus as in claim 34, wherein the vertical cavity surface emitting lasers comprise oxide vertical cavity surface emitting lasers.

36. An apparatus as in claim 31, wherein the array of optoelectronic devices comprises photodetectors.

37. An apparatus as in claim 31, wherein the optical elements are optical fibers.

38. An apparatus as in claim 31, wherein the optical elements are lenses.

39. An apparatus as in claim 31, wherein the array of optical elements is a lenslet array.

40. An apparatus as in claim 31, wherein the optical elements are diffractive optical elements.

41. An apparatus as in claim 31, wherein the optical elements are filters.

42. An apparatus as in claim 31, wherein the optical elements are packaged in a ferrule.

43. An apparatus as in claim 31, wherein the mounting structure is a flexible printed circuit board.

44. An apparatus comprising:
   a) a mounting structure;
   b) a heat spreader passing along a surface of a head region of the mounting structure;
   c) a window in the head region of the mounting structure, the window functioning to provide access to the heat spreader;
   d) an array of optoelectronic devices adapted to the heat spreader in such a manner that the array of optoelectronic devices is accessible through the window in the mounting structure;
   e) an array of optical elements, the array of optical elements having at least a first end;
   f) the first end of the array of optical elements positioned relative to the first end of the array of optoelectronic devices in such a manner that one or more optical elements is optically aligned to one or more optoelectronic devices.

45. An apparatus as in claim 44, wherein the heat spreader provides mechanical rigidity or stiffness to the mounting structure.

46. An apparatus as in claim 44, wherein the array of optoelectronic devices comprises vertical cavity surface emitting lasers.

47. An apparatus as in claim 46, wherein the vertical cavity surface emitting lasers comprise oxide vertical cavity surface emitting lasers.

48. An apparatus as in claim 44, wherein the array of optoelectronic devices comprises photodetectors.

49. An apparatus as in claim 44, wherein the optical elements are optical fibers.

50. An apparatus as in claim 44, wherein the optical elements are lenses.

51. An apparatus as in claim 44, wherein the array of optical elements is a lenslet array.

52. An apparatus as in claim 44, wherein the optical elements are diffractive optical elements.

53. An apparatus as in claim 44, wherein the optical elements are filters.

54. An apparatus as in claim 44, wherein the optical elements are packaged in a ferrule.

55. An apparatus as in claim 44, wherein the mounting structure is a flexible printed circuit board.

56. An apparatus comprising:
   a) a mounting structure;
   b) a height adjuster passing along a surface of a head region of the mounting structure;
   c) a window in the head region of the mounting surface, the window functioning to provide access to the height adjuster;
   d) an array of optoelectronic devices adapted to the height adjuster in such a manner that the array of optoelectronic devices is accessible through the window in the mounting structure;
   e) an array of optical elements, the array of optical elements having at least a first end; and
   f) the first end of the array of optical elements positioned relative to the first end of the array of optoelectronic devices in such a manner that one or more optical elements is optically aligned to one or more optoelectronic devices.

57. An apparatus as in claim 56, wherein the height adjuster provides mechanical rigidity or stiffness to the mounting structure.

58. An apparatus as in claim 56, wherein the array of optoelectronic devices comprises vertical cavity surface emitting lasers.

59. An apparatus as in claim 58, wherein the vertical cavity surface emitting lasers comprise oxide vertical cavity surface emitting lasers.

60. An apparatus as in claim 56, wherein the array of optoelectronic devices comprises photodetectors.

61. An apparatus as in claim 56, wherein the optical elements are optical fibers.

62. An apparatus as in claim 56, wherein the optical elements are lenses.

63. An apparatus as in claim 56, wherein the array of optical elements is a lenslet array.

64. An apparatus as in claim 56, wherein the optical elements are diffractive optical elements.

65. An apparatus as in claim 56, wherein the optical elements are filters.

66. An apparatus as in claim 56, wherein the optical elements are packaged in a ferrule.

67. An apparatus as in claim 56, wherein the mounting structure is a flexible printed circuit board.

68. An apparatus comprising:
   a) a mounting structure;
   b) an electrical plane passing along a surface of a head region of the mounting structure;
   c) a window in the head region of the mounting structure, the window functioning to provide access to the electrical plane;
   d) an array of optoelectronic devices adapted to the electrical plane in such a manner that the array of optoelectronic devices is accessible through the window in the mounting structure;
   e) an array of optical elements, the array of optical elements having at least a first end; and
   f) the first end of the array of optical elements positioned relative to the first end of the array of optoelectronic devices in such a manner that one or more optical elements is optically aligned to one or more optoelectronic devices.

69. An apparatus as in claim 68, wherein the electrical plane further comprises an electrical contact and ground plane.

70. An apparatus as in claim 68, wherein the electrical plane functions as an electrical contact path to at least one electrical or optoelectronic component on the mounting structure.

71. An apparatus as in claim 68, wherein the electrical plane functions to limit electromagnetic interference to at least one electrical or optoelectronic component on the mounting structure.

72. An apparatus as in claim 68, wherein the electrical plane provides mechanical rigidity or stiffness to the mounting structure.

73. An apparatus as in claim 68, wherein the array of optoelectronic devices comprises vertical cavity surface emitting lasers.

74. An apparatus as in claim 73, wherein the vertical cavity surface emitting lasers comprise oxide vertical cavity surface emitting lasers.

75. An apparatus as in claim 68, wherein the array of optoelectronic devices comprises photodetectors.

76. An apparatus as in claim 68, wherein the optical elements are optical fibers.

77. An apparatus as in claim 68, wherein the optical elements are lenses.

78. An apparatus as in claim 68, wherein the array of optical elements is a lenslet array.

79. An apparatus as in claim 68, wherein the optical elements are diffractive optical elements.

80. An apparatus as in claim 68, wherein the optical elements are filters.

81. An apparatus as in claim 68, wherein the optical elements are packaged in a ferrule.

82. An apparatus as in claim 68, wherein the mounting structure is a flexible printed circuit board.

* * * * *

UNITED STATES PATENT AND TRADEMARK OFFICE
CERTIFICATE OF CORRECTION

PATENT NO.     : 6,799,902 B2
DATED          : October 5, 2004
INVENTOR(S)    : Gene R. Anderson et al.

It is certified that error appears in the above-identified patent and that said Letters Patent is hereby corrected as shown below:

Column 1,
Before line 30, the following paragraph should be inserted:
-- The United States government has rights in this invention pursuant to Contract Number DE-AC04-94AL85000 between the United States Department of Energy and the Lockheed Martin Corporation for the operation of the Sandia National Laboratory. --

Signed and Sealed this

Second Day of August, 2005

JON W. DUDAS
*Director of the United States Patent and Trademark Office*